(12) United States Patent
Woo et al.

(10) Patent No.: US 11,557,604 B2
(45) Date of Patent: Jan. 17, 2023

(54) SEMICONDUCTOR DEVICE AND MANUFACTURING METHOD OF THE SAME

(71) Applicant: SAMSUNG ELECTRONICS CO., LTD., Suwon-si (KR)

(72) Inventors: Seongyeon Woo, Incheon (KR); Sangjun Hong, Hwaseong-si (KR); Jinsoo Lim, Yongin-si (KR); Jisung Cheon, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 301 days.

(21) Appl. No.: 17/025,120

(22) Filed: Sep. 18, 2020

(65) Prior Publication Data

US 2021/0183885 A1 Jun. 17, 2021

(30) Foreign Application Priority Data

Dec. 16, 2019 (KR) ........................ 10-2019-0168141

(51) Int. Cl.
| | |
|---|---|
| *H01L 27/11582* | (2017.01) |
| *H01L 27/11565* | (2017.01) |
| *G11C 8/14* | (2006.01) |
| *H01L 27/11556* | (2017.01) |
| *H01L 27/11519* | (2017.01) |

(52) U.S. Cl.
CPC ......... *H01L 27/11582* (2013.01); *G11C 8/14* (2013.01); *H01L 27/11519* (2013.01); *H01L 27/11556* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 8,278,170 | B2 | 10/2012 | Lee et al. |
| 8,409,977 | B2 | 4/2013 | Shim et al. |
| 8,921,921 | B2 | 12/2014 | Ahn |
| 2019/0164990 | A1 | 5/2019 | Kanamori |
| 2020/0350326 | A1* | 11/2020 | Yun ................ H01L 23/5226 |

FOREIGN PATENT DOCUMENTS

| | | |
|---|---|---|
| KR | 10-2011-0107985 A | 10/2011 |
| KR | 10-1182812 B1 | 9/2012 |
| KR | 10-2019-0061124 A | 6/2019 |

* cited by examiner

*Primary Examiner* — Hsien Ming Lee
(74) *Attorney, Agent, or Firm* — Lee IP Law, P.C.

(57) ABSTRACT

A semiconductor device includes: a first gate stack including a plurality of first gate electrodes; a second gate stack arranged on the first gate stack and including a plurality of second gate electrodes; and a plurality of channel structures arranged in a plurality of channel holes penetrating the first gate stack and the second gate stack. Each of the channel holes includes a first channel hole portion penetrating the first gate stack and a second channel hole portion penetrating the second gate stack, and a ratio of a second width in the second direction to a first width in the first direction of an upper end of the first channel hole portion is less than a ratio of a fourth width in the second direction to a third width in the first direction of an upper end of the second channel hole portion.

20 Claims, 27 Drawing Sheets

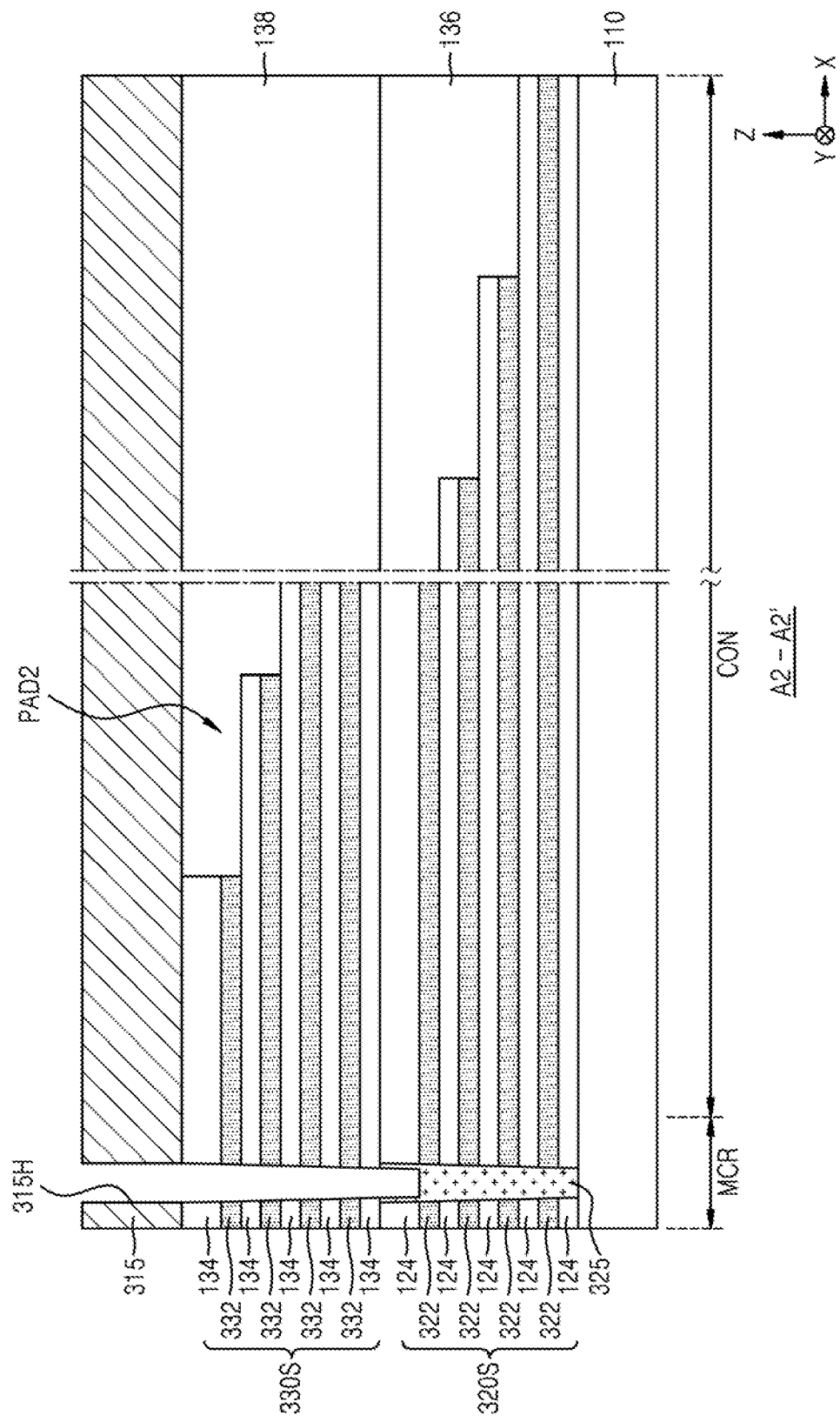

SEMICONDUCTOR DEVICE AND MANUFACTURING METHOD OF THE SAME

CROSS-REFERENCE TO RELATED APPLICATION

Korean Patent Application No. 10-2019-0168141, filed on Dec. 16, 2019, in the Korean Intellectual Property Office, and entitled: "Semiconductor Device and Method of manufacturing the same," is incorporated by reference herein in its entirety.

BACKGROUND

1. Field

Embodiments relate to a semiconductor device and a method of manufacturing the same.

2. Description of the Related Art

As the degree of integration of memory devices increases, memory devices having vertical transistor structures have been proposed instead of memory devices having general planar transistor structures. A memory device having a vertical transistor structure includes a channel structure extending in a vertical direction on a substrate.

SUMMARY

Embodiments are directed to a semiconductor device, including: first gate stack arranged on a substrate and including a plurality of first gate electrodes and a plurality of first insulating layers that are alternately arranged; a second gate stack arranged on the first gate stack and including a plurality of second gate electrodes and a plurality of second insulating layers that are alternately arranged; and a plurality of channel structures arranged in a plurality of channel holes, the plurality of channel holes penetrating the first gate stack and the second gate stack and being spaced apart from each other in a first direction and a second direction that are parallel with a top surface of the substrate. Each of the plurality of channel holes may include a first channel hole portion penetrating the first gate stack and a second channel hole portion penetrating the second gate stack, and a ratio of a second width in the second direction to a first width in the first direction of a first channel hole upper end of the first channel hole portion may be less than a ratio of a fourth width in the second direction to a third width in the first direction of a second channel hole upper end of the second channel hole portion.

Embodiments are also directed to a semiconductor device, including: a plurality of first gate electrodes arranged on a substrate and spaced apart from each other in a direction perpendicular to a top surface of the substrate; a plurality of second gate electrodes arranged on the plurality of first gate electrodes and spaced apart from each other in a direction perpendicular to the top surface of the substrate; a plurality of channel structures in a plurality of channel holes penetrating the plurality of first gate electrodes and the plurality of second gate electrodes; and a common source line region extending in a first direction parallel with the top surface of the substrate on one side of the plurality of first gate electrodes and the plurality of second gate electrodes. Each of the plurality of channel holes may include a first channel hole portion penetrating the plurality of first gate electrodes, and a second channel hole portion penetrating the plurality of second gate electrodes, and a ratio of a second width in a second direction to a first width in the first direction of a first channel hole upper end of the first channel hole portion may be less than a ratio of a fourth width in the second direction to a third width in the first direction of a second channel hole upper end of the second channel hole portion.

Embodiments are also directed to a semiconductor device, including: a plurality of first gate electrodes arranged on a substrate and spaced apart from each other in a direction perpendicular to a top surface of the substrate; a plurality of second gate electrodes arranged on the plurality of first gate electrodes and spaced apart from each other in a direction perpendicular to the top surface of the substrate; a plurality of channel structures in a plurality of channel holes penetrating the plurality of first gate electrodes and the plurality of second gate electrodes; and a common source line extending in a first direction parallel with the top surface of the substrate on one side of the plurality of first gate electrodes and the plurality of second gate electrodes. The plurality of channel structures may include a first horizontal cross-section at an identical level to that of an uppermost first gate electrode, and a second horizontal cross-section at an identical level to that of an uppermost second gate electrode, and the first horizontal cross-section may have an elliptical shape having a long axis in the first direction, and the second horizontal cross-section has an elliptical shape having a long axis in a second direction that is parallel with the top surface of the substrate and perpendicular to the first direction.

BRIEF DESCRIPTION OF THE DRAWINGS

Features will become apparent to those of skill in the art by describing in detail example embodiments with reference to the attached drawings in which:

FIGS. 18A through 22B are schematic diagrams of a manufacturing method of a semiconductor device according to a process sequence, according to an example embodiment; FIGS. 18A, 19A, 20, 21, and 22A are cross-sectional views corresponding to sections taken along the line A1-A1' in FIG. 2, FIGS. 18B, 19B, and 22B are cross-sectional views taken along the line A2-A2' in FIG. 2.

DETAILED DESCRIPTION

Figure 1:
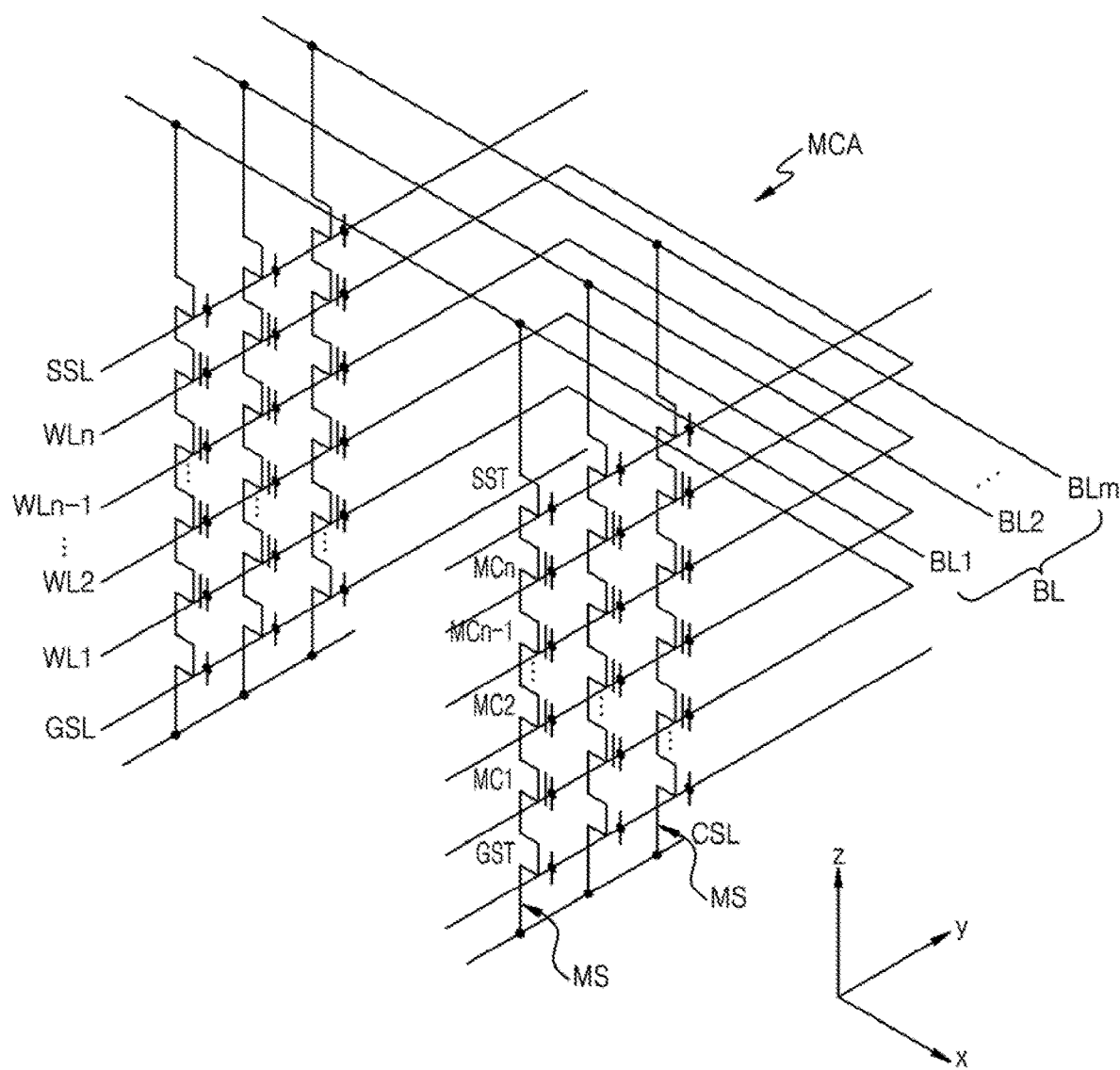
FIG. 1 illustrates an equivalent circuit diagram of a memory cell array of a semiconductor device, according to an example embodiment.

FIG. 1 illustrates an equivalent circuit diagram of a memory cell array MCA of a semiconductor device, according to an example embodiment.

FIG. 1 illustrates an example an equivalent circuit diagram of a vertical NAND (VNAND) flash memory device having a vertical channel structure. Referring to FIG. 1, the memory cell array MCA may include a plurality of memory cell strings MS on a substrate (not illustrated) in a vertical direction (Z direction in FIG. 1). Each of the plurality of memory cell strings MS may include a plurality of memory cells MC1, MC2 . . . , MCn−1, and MCn, a string select transistor SST, and a ground select transistor GST, which are connected in series to each other. The plurality of memory cells MC1, MC2, . . . , MCn−1, and MCn may store data, and the plurality of word lines (WL1, WL2, WLn−1, and WLn may be respectively connected to the memory cells MC1, MC2, . . . , MCn−1, and MCn to control the corresponding memory cells MC1, MC2, . . . , MCn−1, and MCn.

A gate terminal of the ground select transistor GST may be connected to a ground select line GSL, and a source terminal of the ground select transistor GST may be connected to a common source line CSL. A gate terminal of the string select transistor SST may be connected to the string select line SSL, a source terminal of the string select transistor SST may be connected to a drain terminal of the memory cell MCn, and a drain terminal of the string select transistor SST may be connected to a corresponding one of a plurality of bit lines BL1, BL2, . . . , BLm (collectively labeled as BL). Although FIG. 1 exemplarily illustrates that each memory cell string MS includes one ground select transistor GST and two string select transistors SST, unlike this case, e.g., one or more ground select transistors GST and one or more string select transistors SST in each memory cell string MS may be formed.

When a signal is applied to the gate terminal of the string select transistor SST via the string select line SSL, signals applied via the plurality of bit lines BL may be applied to the plurality of memory cells MC1, MC2, . . . , MCn−1, and MCn to perform a data write operation. When a signal is applied to the gate terminal of the ground select transistor GST via a ground select line GSL, an erase operation of the plurality of memory cells MC1, MC2, . . . , MCn−1, and MCn may be performed.

FIGS. 2 through 7 are diagrams for explaining a semiconductor device 100 according to example embodiments.

Figure 2:
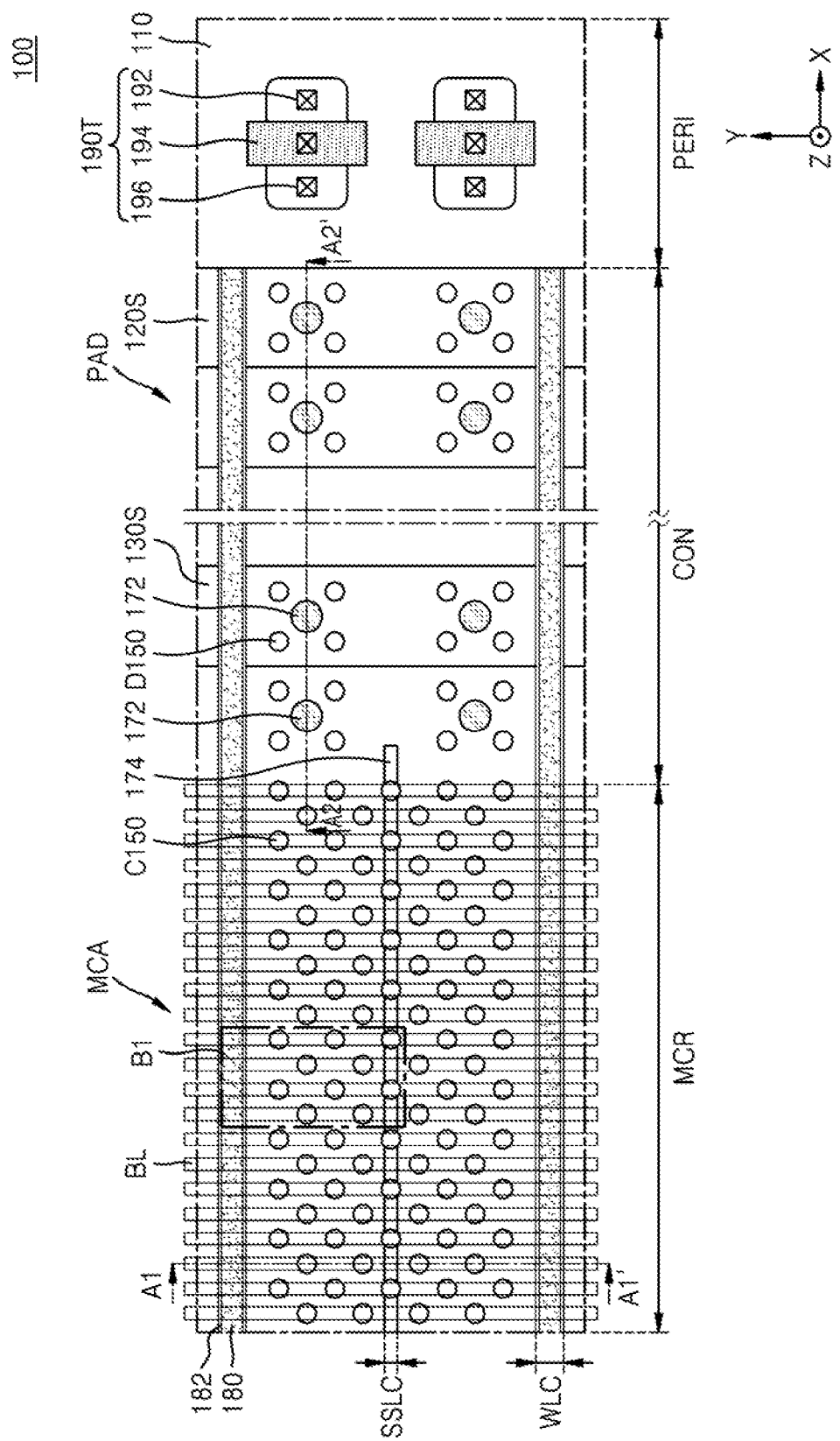
FIG. 2 is a plan view illustrating a representative configuration of a semiconductor device, according to an example embodiment.
Figure 3:
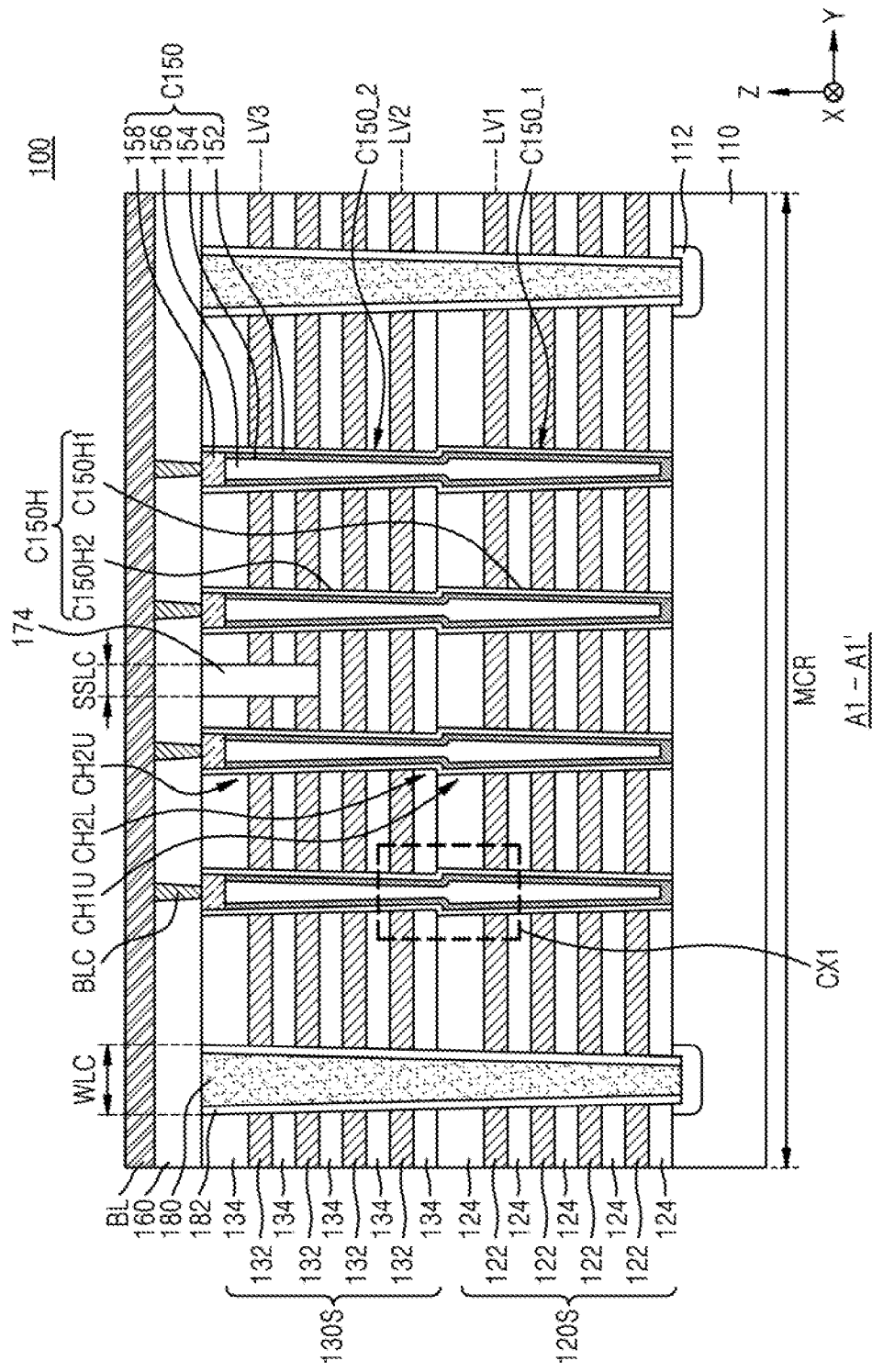
FIG. 3 is a cross-sectional view taken along line A1-A1' in FIG. 2.
Figure 4:
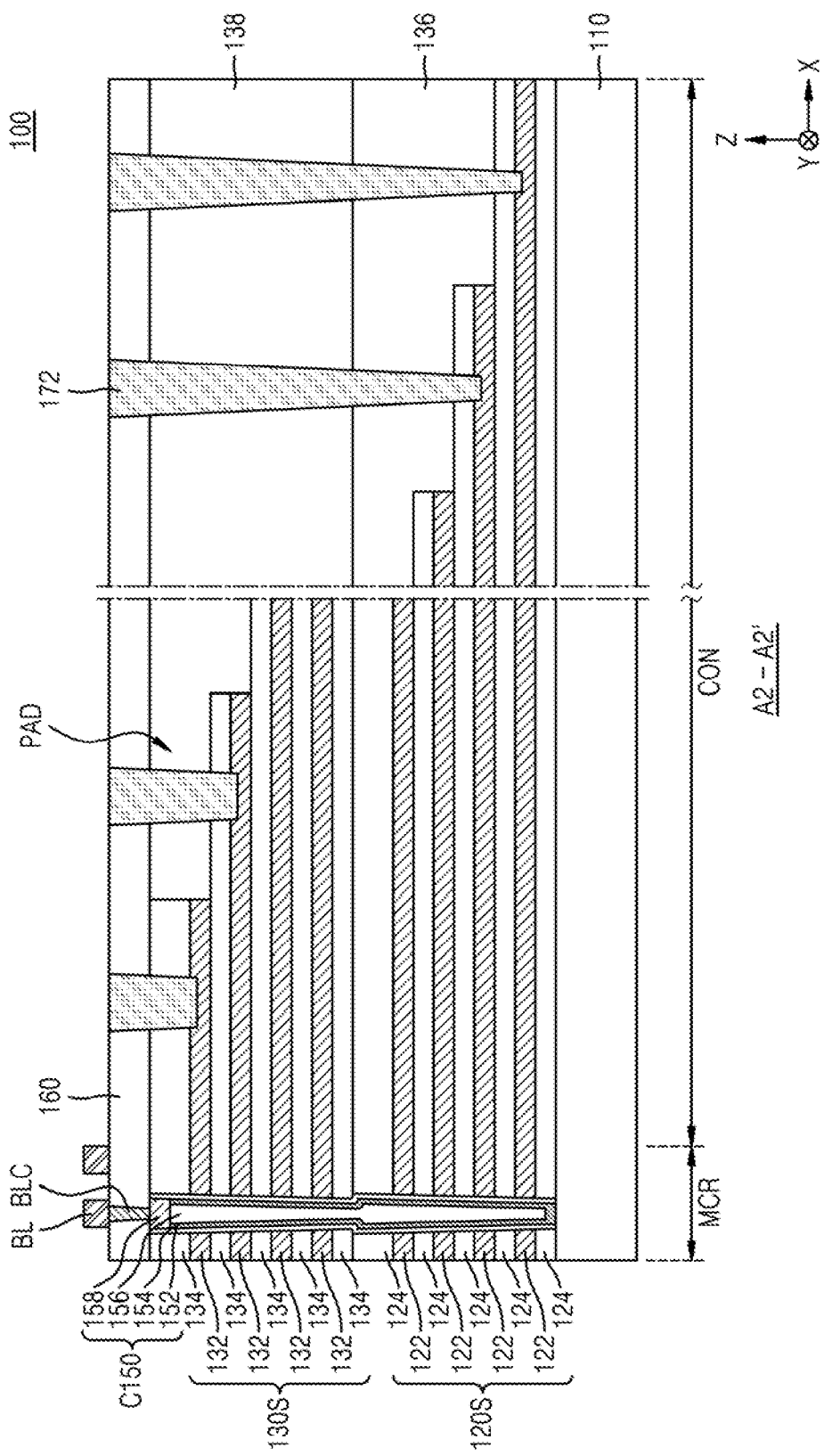
FIG. 4 is a cross-sectional view taken along line A2-A2' in FIG. 2.
Figure 5:
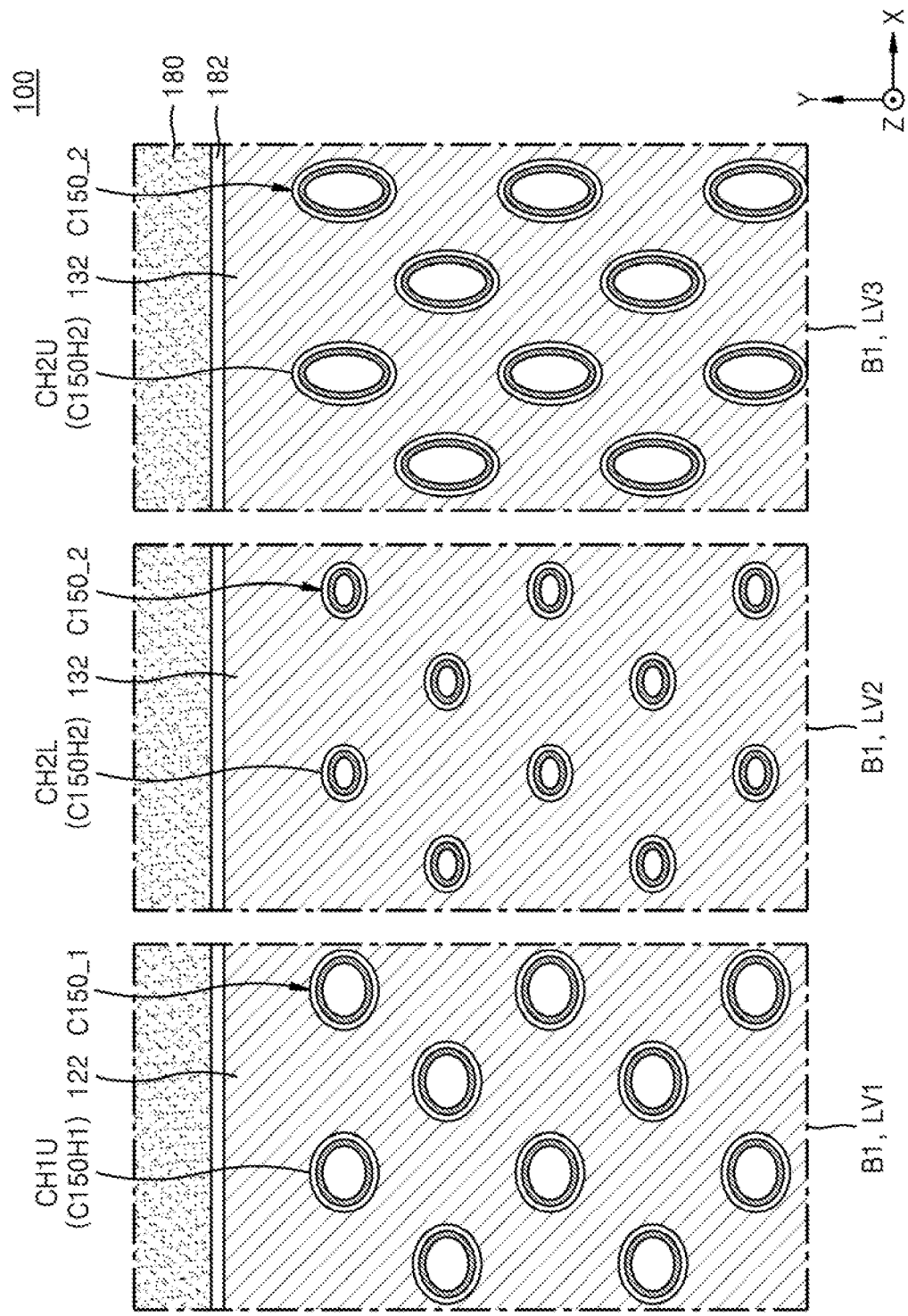
FIG. 5 illustrates horizontal cross-sectional views at first through third vertical levels of FIG. 3 with respect to region B1 in FIG. 2.
Figure 6:
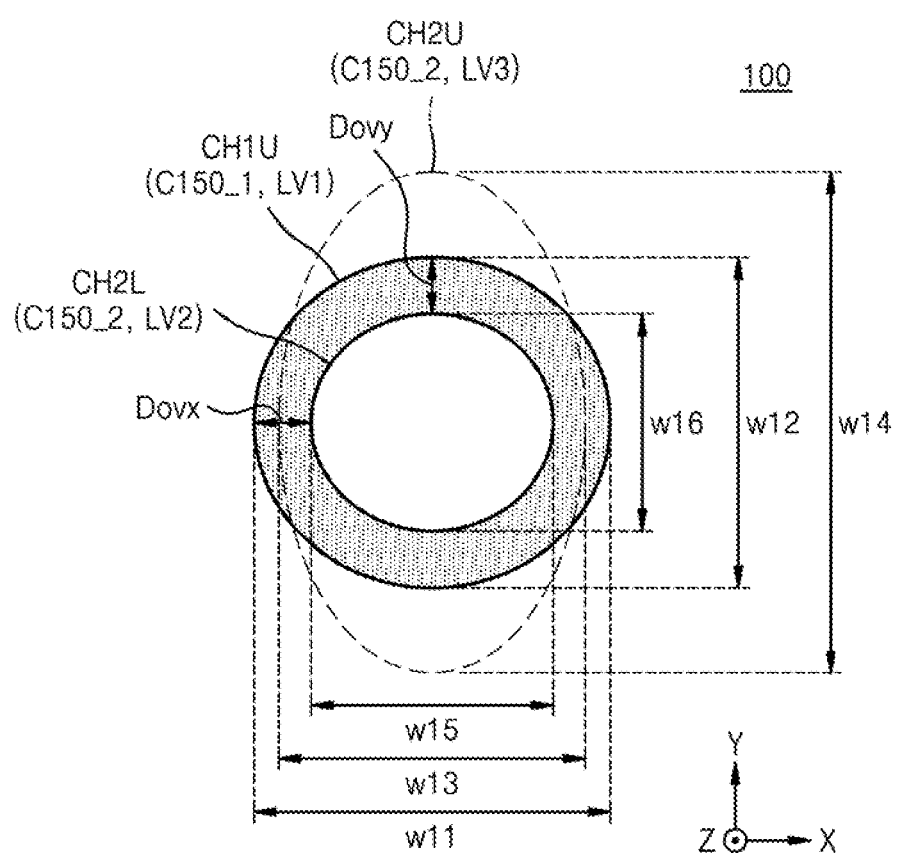
FIG. 6 is a plan view schematically illustrating an arrangement at a connection portion between a first channel portion and a second channel portion.
Figure 7:
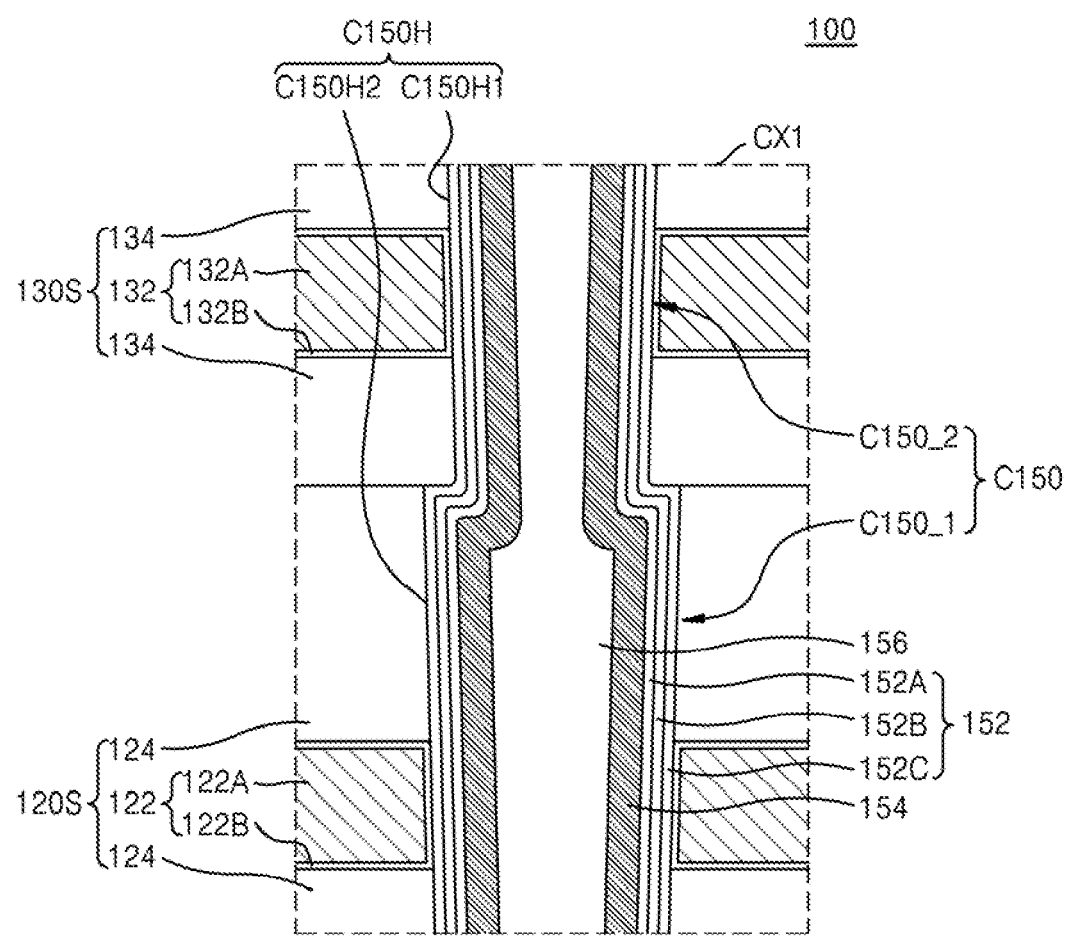
FIG. 7 is an enlarged cross-sectional view of region CX1 in FIG. 3.

FIG. 2 is a plan view illustrating a representative configuration of the semiconductor device 100, according to an example embodiment. FIG. 3 is a cross-sectional view taken along line A1-A1' in FIG. 2. FIG. 4 is a cross-sectional view taken along line A2-A2' in FIG. 2. FIG. 5 illustrates horizontal cross-sectional views at first through third vertical levels LV1, LV2, and LV3 in FIG. 3 with respect to region B1 in FIG. 2. FIG. 6 is a plan view schematically illustrating an arrangement at a connection portion between a first channel portion and a second channel portion. FIG. 7 is an enlarged cross-sectional view of region CX1 in FIG. 3. In FIG. 2, only some components of the semiconductor device 100 are schematically illustrated for convenience of illustration and understanding.

Referring to FIGS. 2 through 7, a substrate 110 may include a memory cell region MCR, a connection region CON, and a peripheral circuit region PERI. A memory cell array MCA may be on the memory cell region MCR, and the memory cell array MCA may include a NAND memory device having a vertical channel structure driven in the manner described above with reference to FIG. 1. A peripheral circuit transistor 190T for driving the memory cell array MCA may be on the peripheral circuit region PERI. The peripheral circuit transistor 190T may include a peripheral circuit active region 192, a peripheral circuit gate electrode 194 on the peripheral circuit active region 192, and a peripheral circuit contact 196 connected to the peripheral circuit active region 192 and the peripheral circuit gate electrode 194. The connection region CON may be an area in which a pad portion PAD for connecting the memory cell array MCA in the memory cell region MCR to the peripheral circuit transistor 190T is formed.

The substrate 110 may include a semiconductor material, e.g., a Group IV semiconductor, a Group III-V compound semiconductor, or a Group II-VI oxide semiconductor. For example, the Group IV semiconductor may include silicon (Si), germanium (Ge), or silicon-germanium. The substrate 110 may be provided as a bulk wafer or an epitaxial layer. In another example embodiment, the substrate 110 may include a silicon-on-insulator (SOI) substrate or a germanium-on-insulator (GeOI) substrate.

On the substrate 110, a first gate stack 120S may extend in a first horizontal direction (X direction) and a second horizontal direction (Y direction) that are parallel with a top surface of the substrate 110. The first gate stack 120S may include a plurality of first gate electrodes 122 and a plurality of first insulating layers 124. The plurality of first gate electrodes 122 and the plurality of first insulating layers 124 may be alternately stacked in the vertical direction (Z direction) perpendicular to the top surface of the substrate 110. As illustrated in FIG. 7, the first gate electrode 122 may include a buried conductive layer 122A and a conductive barrier layer 122B that surrounds a top surface, a bottom surface, and side surfaces of the buried conductive layer 122A.

A second gate stack 130S may be on the first gate stack 120S. The second gate stack 130S may include a plurality of second gate electrodes 132 and a plurality of second insulating layers 134. The plurality of second gate electrodes 132 and the plurality of second insulating layers 134 may be alternately stacked in the vertical direction (Z direction). As illustrated in FIG. 7, the second gate electrode 132 may include a buried conductive layer 132A and a conductive barrier layer 132B that surrounds a top surface, a bottom surface, and side surfaces of the buried conductive layer 132A. An upper insulating layer 160 may be further arranged on the second gate stack 130S.

In an example embodiment, the plurality of first gate electrodes 122 and the plurality of second gate electrodes 132 may correspond to the ground select line GSL, the word lines WL1, WL2, . . . , WLn−1, and WLn, and the string select line SSL, which constitute the memory cell string MS (refer to FIG. 1). For example, the lowermost first gate electrode 122 may function as the ground select line GSL, the uppermost second gate electrode 132 may function as the string select line SSL, and the remaining first gate electrodes 122 and the remaining second gate electrodes 132 may function as the word lines WL1, WL2, . . . , WLn−1, and WLn. Accordingly, the memory cell string MS in which the ground select transistor GST, the string select transistor SST, and the memory cells MC1, MC2, . . . , MCn−1, and MCn therebetween are connected in series may be provided.

In an example embodiment, at least one of an uppermost second gate electrode 132 among the remaining second gate electrodes 132, the uppermost first gate electrode 122, and a lowermost second gate electrode 132 among the remaining second gate electrodes 132 may function as a dummy word line.

As illustrated in FIG. 2, a plurality of word line cut regions WLC may extend in parallel with the top surface of the substrate 110 in the first horizontal direction (X direction). The first gate stack 120S and the second gate stack 130S between two adjacent word line cut regions WLC may constitute one block, and the two adjacent word line cut regions WLC may limit widths of the first gate stack 120S and the second gate stack 130S in the second horizontal direction (Y direction).

On the substrate 110, a plurality of common source lines 180 vertically overlapping the plurality of word line cut regions WLC may be arranged in the first horizontal direction (X direction). Insulating spacers 182 may be on both sidewalls of the plurality of common source lines 180. For example, the insulating spacer 182 may be between the plurality of first gate electrodes 122 and the common source line 180, and between the plurality of second gate electrodes 132 and the common source line 180.

In an example embodiment, the plurality of common source lines 180 may extend to a level lower than the top surface of the substrate 110. In FIG. 3, it is illustrated that top surfaces of the plurality of common source lines 180 are at the same level as a top surface of the second gate stack 130S. However, unlike this case, the top surfaces of the plurality of common source lines 180 may be at a lower level than the top surface of the second gate stack 130S, and an additional insulating layer (not illustrated) may fill the plurality of word line cut regions WLC on the plurality of common source lines 180.

A plurality of common source regions 112 may be in the substrate 110 under the common source line 180 in the first horizontal direction (X direction). The plurality of common source regions 112 may be impurity regions including n-type impurities heavily doped thereon. The plurality of common source regions 112 may function as a source region for supplying current to the plurality of memory cells MC1, MC2, . . . , MCn−1, and MCn. The plurality of common source regions 112 may be positioned to overlap the plurality of word line cut regions WLC.

As illustrated in FIGS. 3 and 4, a plurality of channel structures C150 may penetrate the first gate stack 120S and the second gate stack 130S from the top surface of the substrate 110 in the memory cell region MCR, and may extend in the vertical direction (Z direction). The plurality of channel structures C150 may be spaced apart from each other at certain intervals in the first horizontal direction (X direction), the second horizontal direction (Y direction), and a third horizontal direction (for example, a diagonal direction), e.g., the plurality of channel structures C150 may be in a zigzag shape or staggered shape.

Each of the plurality of channel structures C150 may be in a channel hole C150H and may include a first channel portion C150_1 and a second channel portion C150_2. The first channel portion C150_1 may be in a first channel hole portion C150H1 passing through the first gate stack 120S. The second channel portion C150_2 may be in a second channel hole portion C150H2 passing through the second gate stack 130S. The second channel portion C150_2 may be arranged such that a lower end thereof is connected to an upper end of the first channel portion C150_1. As illustrated in FIG. 7, at a connection portion of the upper end of the first channel portion C150_1 and the lower end of the second channel portion C150_2, a width of the upper end of the first channel portion C150_1 may be less than a width of the lower end of the second channel portion C150_2, and accordingly, a step portion protruding outward from a sidewall of the channel structure C150 may be defined.

Each of the plurality of channel structures C150 may include a gate insulating layer 152, a channel layer 154, a buried insulating layer 156, and a conductive plug 158. The gate insulating layer 152 and the channel layer 154 may be sequentially arranged on an inner wall of the channel hole C150H. For example, the gate insulating layer 152 may be conformally arranged on a sidewall of the second channel hole portion C150H2 and a sidewall of the first channel hole portion C150H1, and the channel layer 154 may be conformally arranged along shapes of the sidewall of the second channel hole portion C150H2 and the sidewall of the first channel hole portion C150H1. The buried insulating layer 156 may be on the channel layer 154 and may fill a residual space of the channel hole C150H. The conductive plug 158 may contact the channel layer 154 and block an entrance of the channel hole C150H (for example, the upper end of the second channel hole portion C150H2), and may be on an upper side of the channel hole C150H. In another example embodiment, the buried insulating layer 156 may be omitted, and the channel layer 154 may be formed in a pillar shape to fill the remaining portion of the channel hole C150H.

In an example embodiment, the channel layer 154 may contact the top surface of the substrate 110 at a bottom portion of the channel hole C150H. Unlike this case, a semiconductor layer (not illustrated) having a certain height may be further formed on the substrate 110 at the bottom portion of the channel hole C150H, and the channel layer 154 may be electrically connected to the substrate 110 via the semiconductor layer.

As illustrated in FIG. 7, the gate insulating layer 152 may have a structure that sequentially includes a tunneling dielectric layer 152A, a charge storage layer 152B, and a blocking dielectric layer 152C on an outer sidewall of the channel layer 154. Relative thicknesses of the tunneling dielectric layer 152A, the charge storage layer 152B, and the blocking dielectric layer 152C that constitute the gate insulating layer 152 are not limited to those illustrated in FIG. 7 and may be variously modified.

The tunneling dielectric layer 152A may include silicon oxide, hafnium oxide, aluminum oxide, zirconium oxide, tantalum oxide, etc. The charge storage layer 152B may be an area in which electrons that have passed through the tunneling dielectric layer 152A from the channel layer 154 are stored, and may include silicon nitride, boron nitride, silicon boron nitride, or polysilicon doped with impurities. The blocking dielectric layer 152C may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

As illustrated in FIGS. 5 and 6, the first channel hole portion C150H1 and the second channel hole portion C150H2 may have a horizontal cross-section of an elliptical shape having a long axis, e.g., a non-circular shape. The first channel hole portion C150H1 and the second channel hole portion C150H2 may have a horizontal cross-section of an elliptical shape having a long axis in different directions from each other. For example, a first channel hole upper end CH1U of the first channel hole portion C150H1 may have a cross-section of an elliptical shape having a long axis extending in the first horizontal direction (X direction). A second channel hole upper end CH2U of the second channel hole portion C150H2 may have a cross-section of an elliptical shape having a long axis extending in the second horizontal direction (Y direction). In addition, a second channel hole lower end CH2L of the second channel hole portion C150H2 may have a cross-section of an elliptical shape having a long axis extending in the first horizontal direction (X direction).

In this case, the first channel hole upper end CH1U may be referred to as a portion of the first channel hole portion C150H1 that is at a level higher than or equal to the uppermost first gate electrode 122, the second channel hole upper end CH2U may be referred to as a portion of the second channel hole portion C150H2 that is at a level higher than or equal to the uppermost second gate electrode 132, and the second channel hole lower end CH2L may be referred to as a portion of the second channel hole portion C150H2 that is at a level lower than or equal to the lowermost second gate electrode 132.

In FIG. 5, horizontal cross-sections of the channel structure C150 at a first vertical level LV1 at the same level as the uppermost first gate electrode 122, a second vertical level LV2 at the same level as the lowermost second gate electrode 132, and a third vertical level LV3 at the same level as the uppermost second gate electrode 132 are illustrated. In other words, in FIG. 5, the horizontal cross-section of the first channel hole upper end CH1U (or the horizontal cross-section of the first channel portion C150_1) at the first vertical level LV1, the horizontal cross-section of the second channel hole lower end CH2L (or the horizontal cross-section of the second channel portion C150_2) at the second vertical level LV2, and the horizontal cross-section of the second channel hole upper end CH2U (or the horizontal cross-section of the second channel portion C150_2) at the third vertical level LV3 are schematically illustrated.

As illustrated in FIG. 5, at the first vertical level LV1, the first channel hole upper end CH1U may have a cross-section of an elliptical shape in which a long axis is arranged in the first horizontal direction (X direction) and a short axis is arranged in the second horizontal direction (Y direction). At the second vertical level LV2, the second channel hole lower end CH2L may have a cross-section of an elliptical shape in which a long axis is arranged in the first horizontal direction (X direction) and a short axis is arranged in the second horizontal direction (Y direction). At the third vertical level LV3, the second channel hole upper end CH2U may have a cross-section of an elliptical shape in which a long axis is arranged in the second horizontal direction (Y direction) and a short axis is arranged in the first horizontal direction (X direction).

FIG. 6 schematically illustrates an arrangement at a connection portion of the first channel hole portion C150H1 and the second channel hole portion C150H2. The first channel hole upper end CH1U of the first channel hole portion C150H1 may have a first width w11 in the first horizontal direction (X direction), and a second width w12 in the second horizontal direction (Y direction). The second width w12 may be less than the first width w11. When a distortion ratio is defined as a width in the second horizontal direction (Y direction) to a width of the first horizontal direction (X direction) with respect to a cross-section of an elliptical shape, accordingly, the distortion ratio of the first channel hole upper end CH1U (that is, a ratio of the second width w12 to the first width w11) may be less than about 1. For example, the distortion ratio of the first channel hole upper end CH1U may range from about 0.5 to about 1.

The second channel hole upper end CH2U of the second channel hole portion C150H2 may have a third width w13 in the first horizontal direction (X direction), and a fourth width w14 in the second horizontal direction (Y direction). The fourth width w14 may be greater than the third width w13. In other words, the distortion ratio of the second channel hole upper end CH2U (that is, a ratio of the fourth width w14 to the third width w13) may be greater than about 1. For example, the distortion ratio of the second channel hole upper end CH2U may range from about 1 to about 2.

The second channel hole lower end CH2L of the second channel hole portion C150H2 may have a fifth width w15 in the first horizontal direction (X direction), and a sixth width w16 in the second horizontal direction (Y direction). The sixth width w16 may be less than the fifth width w15. In other words, the distortion ratio of the second channel hole lower end CH2L (that is, a ratio of the sixth width w16 to the fifth width w15) may be less than about 1. For example, the distortion ratio of the second channel hole lower end CH2L may range from about 0.5 to about 1. The fifth width w15 of the second channel hole lower end CH2L may be less than the first width w11 of the first channel hole upper end CH1U, and the sixth width w16 of the second channel hole lower end CH2L may be less than the second width w12 of the first channel hole upper end CH1U.

As illustrated in FIG. 6, the second channel hole lower end CH2L may have a distortion ratio less than about 1, similar to the first channel hole upper end CH1U, and the second channel hole lower end CH2L may be arranged at a substantially uniform separation distance from the first channel hole upper end CH1U. For example, the second channel hole lower end CH2L may be spaced apart from the first channel hole upper end CH1U by the first horizontal distance Dovx in the first horizontal direction (X direction), and may be spaced apart by a second horizontal distance Dovy in the second horizontal direction (Y direction). The second horizontal distance Dovy may have a value similar to the first horizontal distance Dovx. Thus, a relatively uniform overlap margin may be secured in all directions at the connection portion between the first channel hole upper end CH1U and the second channel hole lower end CH2L, and a process defect due to misalignment of the second channel hole portion C150H2 in the forming process of the second channel hole portion C150H2 may be prevented or reduced.

As illustrated in FIG. 3, a bit line contact BLC may penetrate the upper insulating layer 160 and contact the conductive plug 158 of the channel structure C150, and on the upper insulating layer 160, the bit line BL in contact with the bit line contact BLC may extend in the second horizontal direction (Y direction).

In one block, two uppermost second gate electrodes 132 may be separated into two portions, each planarly, by a string separation insulating layer 174. The string separation insulating layer 174 may extend from the same level as the top surface of the uppermost second insulating layer 134 to a level lower than the bottom surface of the uppermost second gate electrode 132, and thus, two of the uppermost second gate electrodes 132 may be separated into two portions, each planarly, by the string separation insulating layer 174 in a string selection line cut region SSLC. In another example embodiment, unlike as illustrated in FIG. 3, the string separation insulating layer 174 may extend from the same level as the top surface of the uppermost second insulating layer 134 (or the top surface of the second gate stack 130S) to a lower level than the bottom surface of the uppermost second gate electrode 132.

In the connection region CON, the first gate stack 120S and the second gate stack 130S may extend to form a pad portion PAD. In the connection region CON, the plurality of first gate electrodes 122 and the plurality of second gate electrodes 132 may extend to have shorter lengths in the first horizontal direction (X direction) away from the top surface of the substrate 110. The pad portion PAD may be referred to as portions of the first gate electrode 122 and the second gate electrode 132 that are arranged in a step form. A lower cover insulating layer 136 may be on the portion of the first gate stack 120S constituting the pad portion PAD, and an upper cover insulating layer 138 may be on the portion of the second gate stack 130S constituting the pad portion PAD. In the connection region CON, a pad contact 172 connected to the first gate electrode 122 or the second gate electrode 132 may be arranged.

As illustrated in FIG. 2, a plurality of channel structures C150 may penetrate the first gate stack 120S and the second gate stack 130S from the top surface of the substrate 110 in the connection region CON, and may extend in the vertical direction (Z direction). A dummy channel structure D150 may be formed to secure structural stability of the semiconductor device 100 in a manufacturing process of the semiconductor device 100. Each of the plurality of dummy channel structures D150 may have a similar structure and a similar shape as the plurality of channel structures C150. In an example embodiment, at least some of the plurality of dummy channel structures D150 may have a greater width than the plurality of channel structures C150.

In general, as the number of gate electrodes stacked in a vertical direction increases, it may become more difficult to form a channel hole in a uniform size and shape over the entire height of the channel hole. Accordingly, a method of sequentially forming the first gate stack 120S and the second gate stack 130S may be considered, but it may be difficult to align the second channel hole portion C150H2 so that the second channel hole portion C150H2 penetrating the second gate stack 130S accurately lands on the first channel hole portion C150H1 passing through the first gate stack 120S. Further, when underetching in a particular direction occurs (that is, asymmetric etching) in the process of forming the channel hole C150H adjacent to the word line cut region WLC, the channel hole C150H may have an asymmetric shape in which an uppermost shape and a bottom portion shape are different from each other.

However, in the semiconductor device 100 according to the above-described example embodiments, the second channel hole upper end CH2U of the second channel hole portion C150H2 may have a horizontal cross-section of an elliptical shape that has a long axis in the second horizontal direction (Y direction), and the first channel hole upper end CH1U of the first channel hole portion C150H1 may have a horizontal cross-section of an elliptical shape that has a long axis in the first horizontal direction (X direction). Thus, even when the second channel hole portion C150H2 has an asymmetric shape (that is, even when the second channel hole lower end CH2L has a horizontal cross-section of an elliptical shape having a long axis in the first horizontal direction (X direction)), a relatively uniform overlap margin may be secured at a connection portion between the first channel hole portion C150H1 and the second channel hole portion C150H2. Accordingly, process defects due to misalignment of the second channel hole portion C150H2 in the process of forming the second channel hole portion C150H2 may be prevented or reduced.

Figure 8:
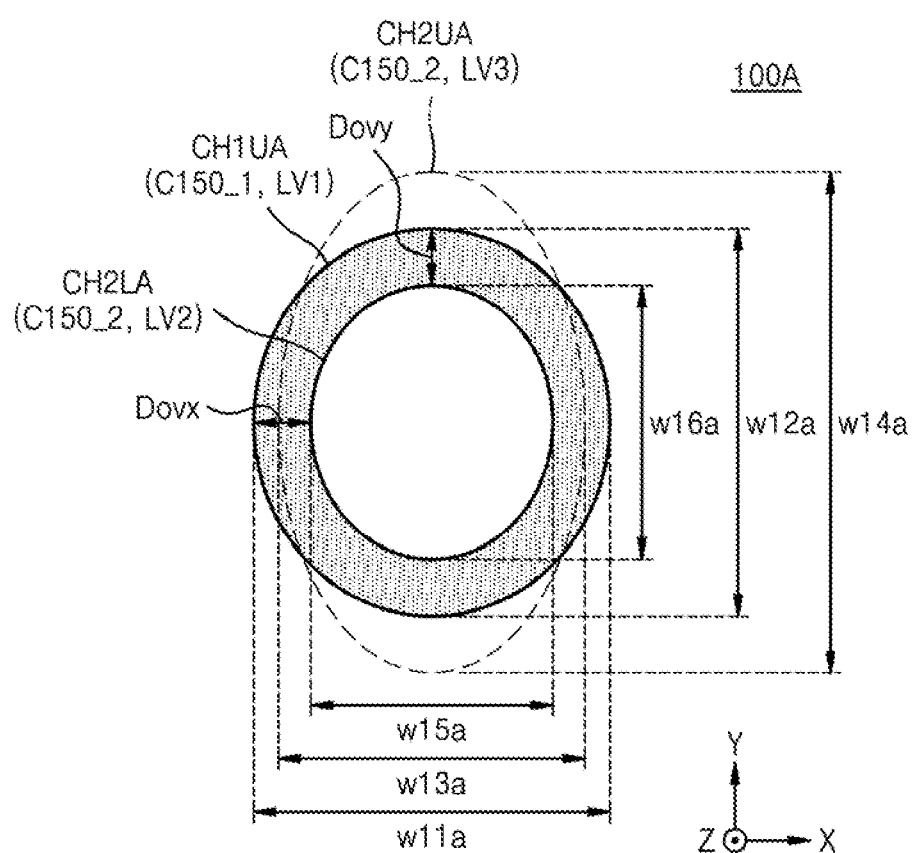
FIG. 8 is a plan view of a semiconductor device according to an example embodiment.

FIG. 8 is a cross-sectional view of a semiconductor device 100A according to an example embodiment. FIG. 8 schematically illustrates an arrangement at a connection portion between the first channel portion C150_1 and the second channel portion C150_2. In FIG. 8, the same reference numerals as those in FIGS. 1 through 7 may denote the same components.

Referring to FIG. 8, the first channel portion C150_1 and the second channel portion C150_2 may have a horizontal cross-section of elliptical shapes having long axes in the same direction while having different distortion ratios from each other. For example, a first channel hole upper end CH1UA may have a cross-section of an elliptical shape having a long axis extending in the second horizontal direction (Y direction). For example, a length of the long axis may correspond to a second width w12a. For example, a second channel hole upper end CH2UA may have a cross-section of an elliptical shape having a long axis extending in the second horizontal direction (Y direction). For example, a length of the long axis may correspond to a fourth width w14a. In addition, the second channel hole lower end CH2LA may have a cross-section of an elliptical shape having a long axis extending in the second horizontal direction (Y direction). For example, a length of the long axis may correspond to a sixth width w16a.

A distortion ratio of the first channel hole upper end CH1UA (that is, a ratio of the second width w12a to a first width w11a) may be greater than about 1. A distortion ratio of the second channel hole upper end CH2UA (that is, a ratio of the fourth width w14a to a third width w13a) may be greater than about 1, and may be greater than the distortion ratio of the first channel hole upper end CH1UA. In addition, a distortion ratio of the second channel hole lower end CH2LA (that is, a ratio of the sixth width w16a to a fifth width w15a) may be greater than about 1, and may have a value similar to the distortion ratio of the first channel hole upper end CH1UA.

In FIG. 8, it is illustrated that the first channel hole upper end CH1UA and the second channel hole lower end CH2LA have long axes extending in the second horizontal direction (Y direction). In another example embodiment, unlike as illustrated in FIG. 8, each of the first channel hole upper end CH1UA and the second channel hole lower end CH2LA may have a long axis in a horizontal direction that is inclined in a range of about 0° to about 45° with respect to the second horizontal direction (Y direction). In addition, the long axis of the second channel hole lower end CH2LA may be inclined in a range of about 0° to about 45° with respect to the long axis of the first channel hole upper end CH1UA.

According to the above-described embodiments, the second channel hole lower end CH2L may be spaced apart from the first channel hole upper end CH1UA by the first horizontal distance Dovx in the first horizontal direction (X direction), and may be spaced apart by a second horizontal distance Dovy in the second horizontal direction (Y direction). The second horizontal distance Dovy may have a value similar to the first horizontal distance Dovx. Thus, a relatively uniform overlap margin may be secured in all directions at the connection portion between the first channel hole upper end CH1UA and the second channel hole lower end CH2LA, and a process defect due to misalignment of the second channel hole portion C150H2 in the forming process of the second channel hole portion C150H2 may be prevented or reduced.

Figure 9:
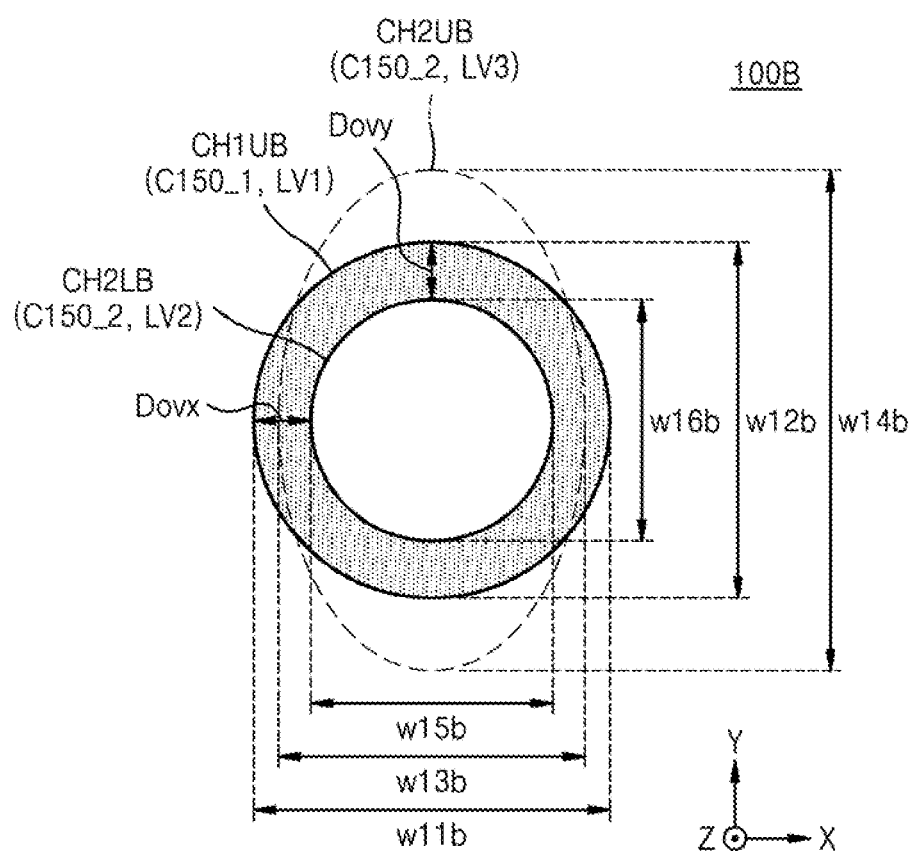
FIG. 9 is a plan view of a semiconductor device according to an example embodiment.

FIG. 9 is a plan view of a semiconductor device 100B according to an example embodiment. FIG. 9 schematically illustrates an arrangement at a connection portion between the first channel portion C150_1 and the second channel portion C150_2. In FIG. 9, the same reference numerals as those in FIGS. 1 through 8 may denote the same components.

Referring to FIG. 9, a second channel hole upper end CH2UB may have a horizontal cross-section of an oval shape having a long axis in the second horizontal direction (Y direction), and a first channel hole upper end CH1UB may have a horizontal cross-section of a substantially circular shape. In addition, a second channel hole lower end CH2LB may have a horizontal cross-section of a substantially circular shape.

A distortion ratio of a first channel hole upper end CH1UB (that is, a ratio of a second width w12$b$ to a first width w11$b$) may have a value of about 1. A distortion ratio of the second channel hole upper end CH2UB (that is, a ratio of a fourth width w14$b$ to a third width w13$b$) may be greater than about 1, and may be greater than the distortion ratio of the first channel hole upper end CH1UB. A distortion ratio of the second channel hole lower end CH2LB (that is, a ratio of a sixth width w16$b$ to a fifth width w15$b$) may have a value of about 1.

The second channel hole lower end CH2LB may be spaced apart from the first channel hole upper end CH1UB by the first horizontal distance Dovx in the first horizontal direction (X direction), and be spaced apart by the second horizontal distance Dovy in the second horizontal direction (Y direction). The second horizontal distance Dovy may have a value similar to the first horizontal distance Dovx. Thus, a relatively uniform overlap margin may be secured in all directions at the connection portion between the first channel hole upper end CH1UB and the second channel hole lower end CH2LB, and a process defect due to misalignment of the second channel hole portion C150H2 in the forming process of the second channel hole portion C150H2 may be prevented or reduced.

In an example embodiment, at least some of the plurality of channel structures C150 may have a horizontal cross-sectional shape as illustrated in FIG. 6, and another of the plurality of channel structures C150 may have a horizontal cross-section as illustrated in FIG. 8 or 9.

For example, the first channel structure C150 adjacent to the word line cut region WLC may have horizontal cross-sections of the first channel portion C150_1 and the second channel portion C150_2 as illustrated in FIG. 6. In addition, the second channel structure C150 relatively far from the word line cut region WLC may have horizontal cross-sections of the first channel portion C150_1 and the second channel portion C150_2 as illustrated in FIG. 8, or horizontal cross-sections of the first channel portion C150_1 and the second channel portion C150_2 as illustrated in FIG. 9.

As another example, the first channel structure C150 adjacent to edge portions of the memory cell region MCR may have horizontal cross-sections of the first channel portion C150_1 and the second channel portion C150_2 as illustrated in FIG. 6. In addition, the second channel structure C150 relatively far from the edge portion of the memory cell region MCR may have horizontal cross-sections of the first channel portion C150_1 and the second channel portion C150_2 as illustrated in FIG. 8, or horizontal cross-sections of the first channel portion C150_1 and the second channel portion C150_2 as illustrated in FIG. 9.

Figure 10:
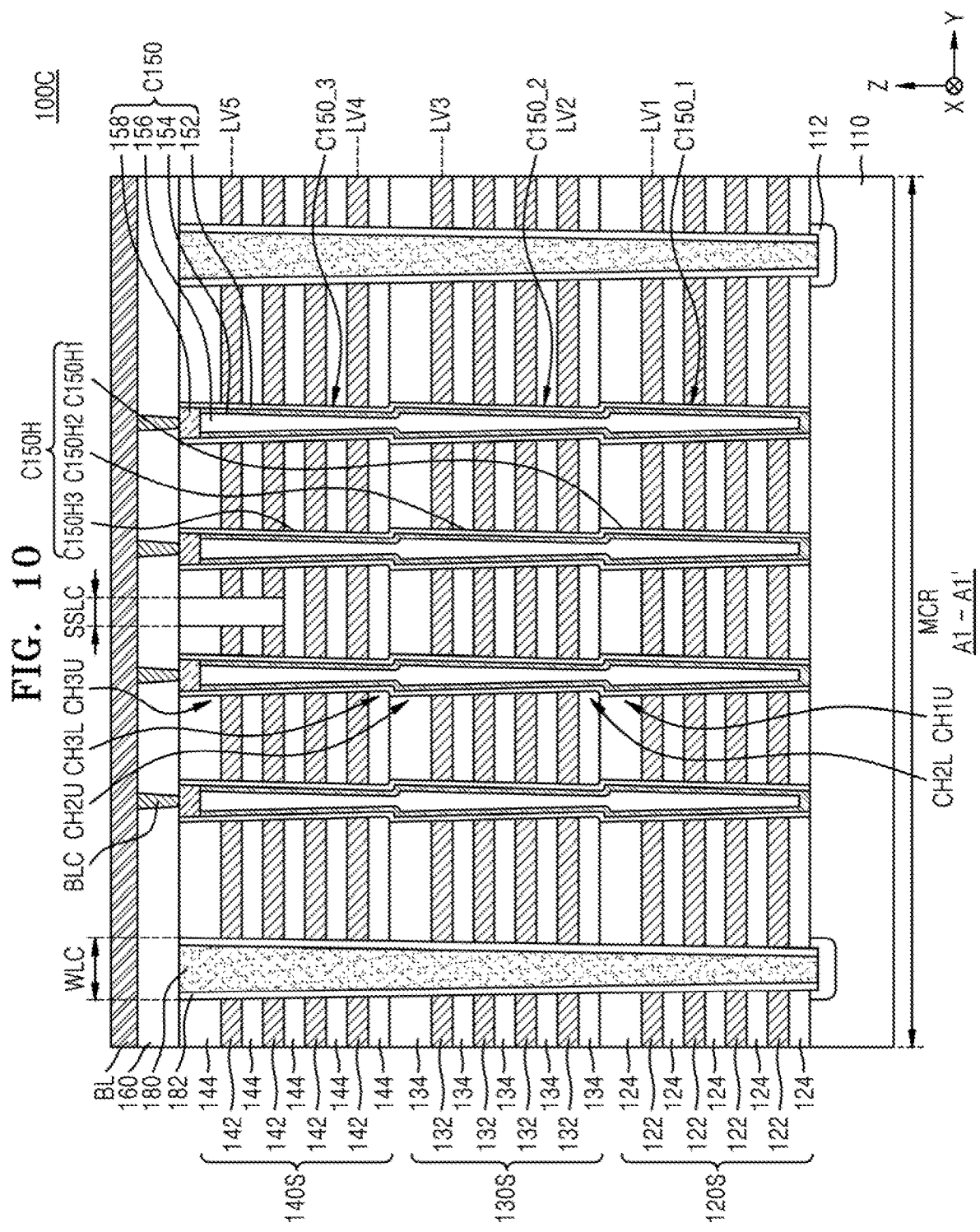
FIG. 10 is a cross-sectional view of a semiconductor device according to an example embodiment.
Figure 11:
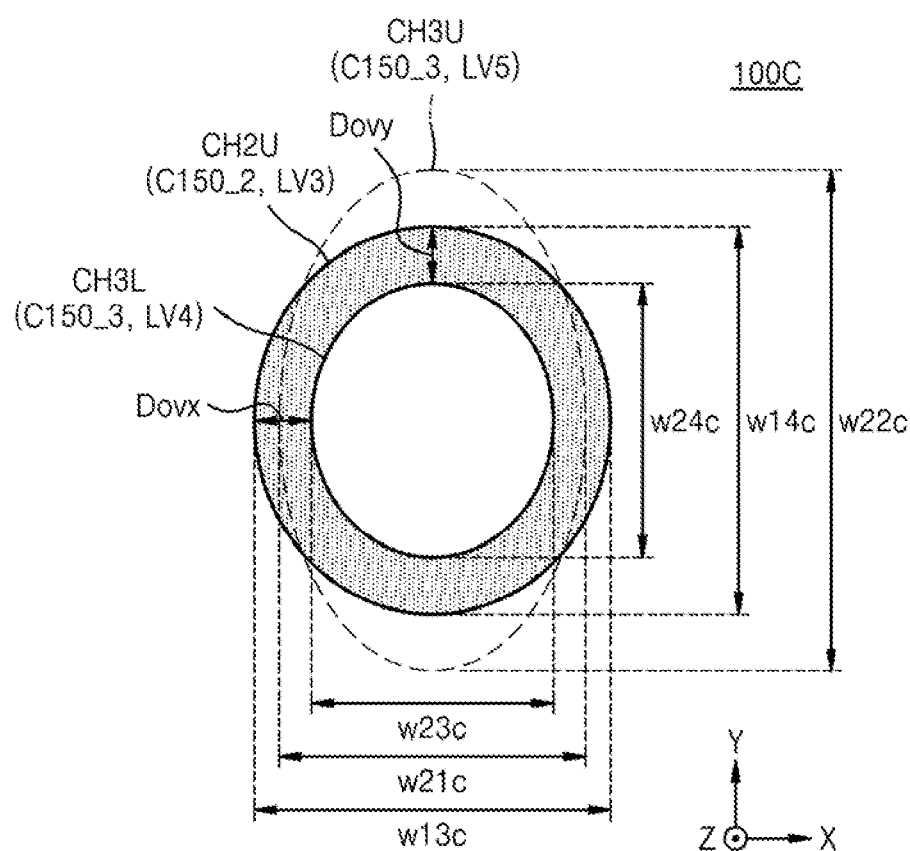
FIG. 11 is a plan view schematically illustrating an arrangement at a connection portion between a second channel portion and a third channel portion.
Figure 12:
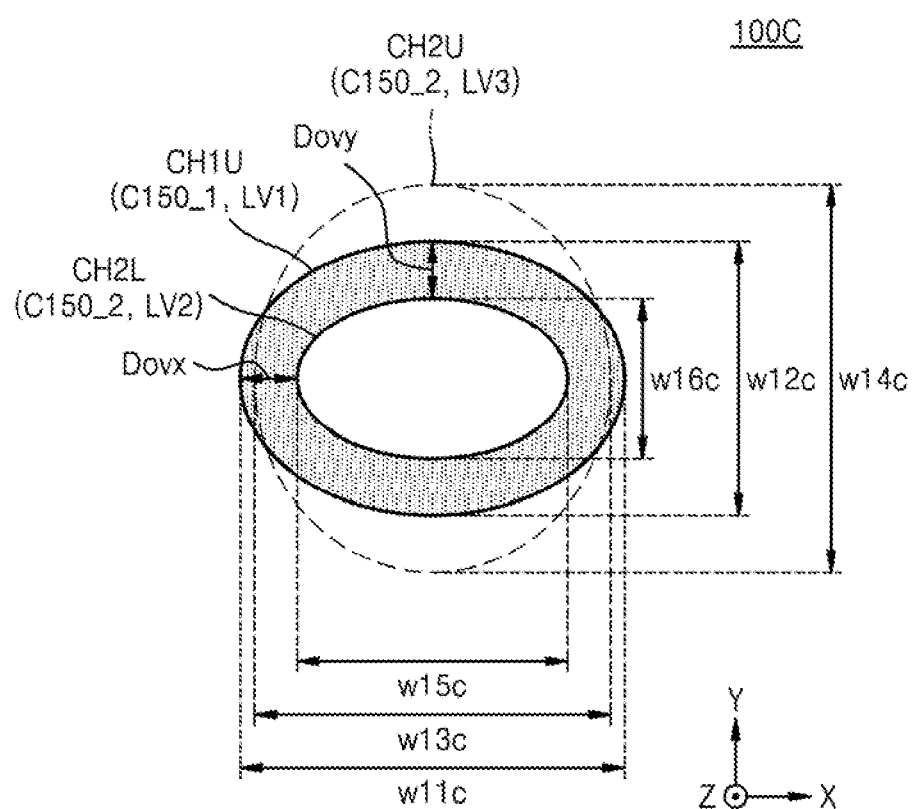
FIG. 12 is a plan view schematically illustrating an arrangement at a connection portion between a first channel portion and the second channel portion.

FIG. 10 is a cross-sectional view of a semiconductor device 100C according to an example embodiment. FIG. 11 is a plan view schematically illustrating an arrangement at a connection portion of the second channel portion C150_2 and the third channel portion C150_3, and FIG. 12 is a plan view schematically illustrating an arrangement at a connection portion of the first channel portion C150_1 and the second channel portion C150_2. In FIGS. 10 through 12, the same reference numerals as those in FIGS. 1 through 9 may denote the same components.

Referring to FIGS. 10 through 12, the semiconductor device 100C may include the first gate stack 120S, the second gate stack 130S, and a third gate stack 140S, which are sequentially stacked on the substrate 110. The third gate stack 140S may include a plurality of third gate electrodes 142 and a plurality of third insulating layers 144 that are alternately stacked on the second gate stack 130S.

The plurality of channel structures C150 may include the first channel portion C150_1, the second channel portion C150_2, and a third channel portion C150_3. The first channel portion C150_1 may be in the first channel hole portion C150H1 penetrating the first gate stack 120S, the second channel portion C150_2 may be in the second channel hole portion C150H2 penetrating the second gate stack 130S, and the third channel portion C150_3 may be in a third channel hole portion C150H3 penetrating the third gate stack 140S.

In FIG. 11, a horizontal cross-section of a third channel hole lower end CH3L of the third channel hole portion C150H3 at a fourth vertical level LV4 identical to a lowermost third gate electrode 142, and a horizontal cross-section of a third channel hole upper end CH3U of the third channel hole portion C150H3 at a fifth vertical level LV5 identical to an uppermost third gate electrode 142 are illustrated together.

In an example embodiment, the third channel hole upper end CH3U may have a horizontal cross-section of an elliptical shape having a long axis in the second horizontal direction (Y direction), and the third channel hole lower end CH3L and the second channel hole upper end CH2U may have horizontal cross-sections of an elliptical shape having a long axis in the second horizontal direction (Y direction). In addition, a distortion ratio of the third channel hole upper end CH3U may be greater than a distortion ratio of the third channel hole lower end CH3L and may be greater than a distortion ratio of the second channel hole upper end CH2U.

For example, a width w21$c$ of the third channel hole upper end CH3U in the first horizontal direction (X direction) may be less than a width w22$c$ of the third channel hole upper end CH3U in the second horizontal direction (Y direction). In addition, a width w23$c$ of the third channel hole lower end CH3L in the first horizontal direction (X direction) may be less than a width w24$c$ of the third channel hole lower end CH3L in the second horizontal direction (Y direction). A width w13c of the second channel hole upper end CH2U in the first horizontal direction (X direction) may be less than a width w14c of the second channel hole upper end CH2U in the second horizontal direction (Y direction).

In FIG. 12, a horizontal cross-section of the second channel hole lower end CH2L of a second channel hole portion C150H2 at the second vertical level LV2 identical to the lowermost second gate electrode 132, and a horizontal cross-section of the first channel hole lower end CH1L of a first channel hole portion C150H1 at the first vertical level LV1 identical to the uppermost first gate electrode 122 are illustrated together.

In an example embodiment, the second channel hole lower end CH2L may have a horizontal cross-section of an elliptical shape having a long axis in the first horizontal direction (X direction), and the first channel hole upper end CH1U may have a horizontal cross-section of an elliptical shape having a long axis in the first horizontal direction (X direction). In addition, the distortion ratio of the second channel hole upper end CH2U may be greater than the distortion ratio of the second channel hole lower end CH2L.

For example, a width w11c of the first channel hole upper end CH1U in the first horizontal direction (X direction) may be greater than a width w12c of the first channel hole upper end CH1U in the second horizontal direction (Y direction). In addition, a width w15c of the second channel hole lower end CH2L in the first horizontal direction (X direction) may be greater than a width w16c of the second channel hole lower end CH2L in the second horizontal direction (Y direction).

According to the example embodiments described above, a relatively uniform overlap margin may be secured in all directions at a connection portion between the first channel hole upper end CH1U and the second channel hole lower end CH2L, and a relatively uniform overlap margin may be secured in all directions at a connection portion between the second channel hole upper end CH2U and the third channel hole lower end CH3L. Accordingly, process defects due to misalignment of the second channel hole portion C150H2 and the third channel hole portion C150H3 may be prevented or reduced.

Figure 13:
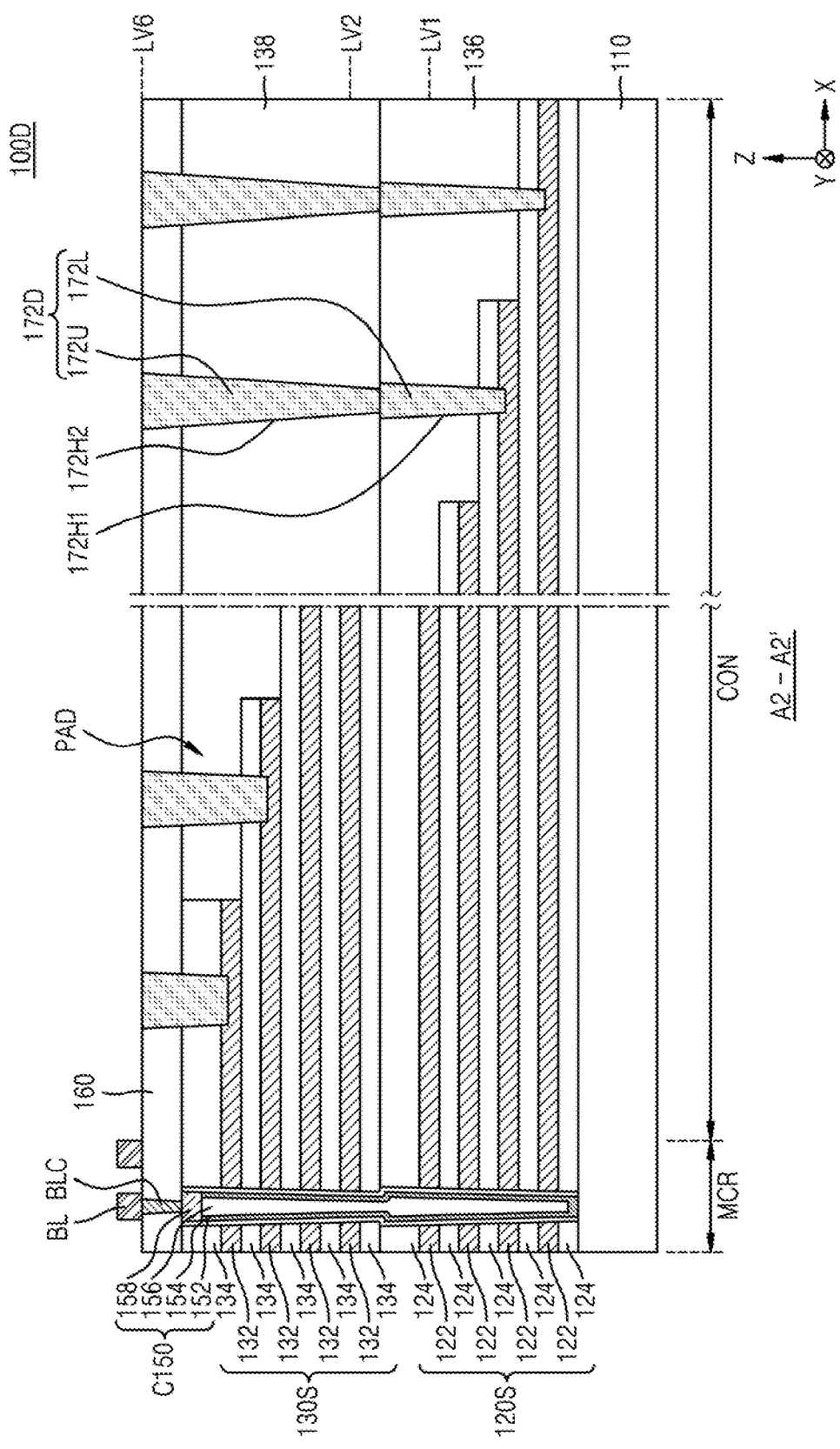
FIG. 13 is a cross-sectional view of a semiconductor device according to an example embodiment.
Figure 14:
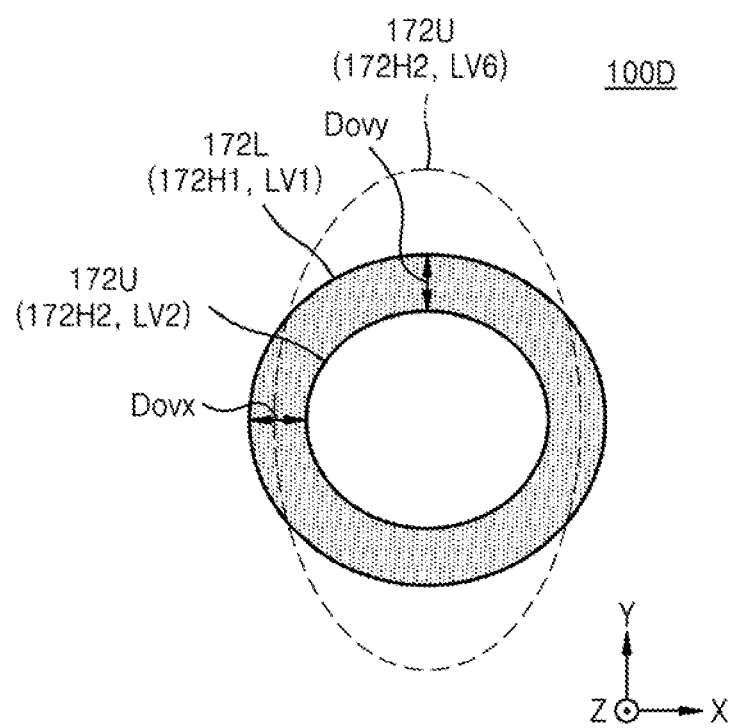
FIG. 14 is a plan view schematically illustrating an arrangement at a connection portion between a lower pad contact and an upper pad contact.

FIG. 13 is a cross-sectional view of a semiconductor device 100D according to an example embodiment. FIG. 14 is a plan view schematically illustrating an arrangement at a connection portion between a lower pad contact 172L and an upper pad contact 172U. In FIGS. 13 and 14, the same reference numerals as those in FIGS. 1 through 12 may denote the same components.

Referring to FIGS. 13 and 14, a pad contact 172D may include the lower pad contact 172L and the upper pad contact 172U. The lower pad contact 172L may be in a lower contact hole 172H1 penetrating the lower cover insulating layer 136, and the upper pad contact 172U may be in an upper contact hole 172H2 penetrating the upper cover insulating layer 138 and the upper insulating layer 160.

In FIG. 14, a horizontal cross-section at the first vertical level LV1 of the lower contact hole 172H1 is illustrated together with a horizontal cross-section at the second vertical level LV2 and a horizontal cross-section at the sixth vertical level LV6 of the upper contact hole 172H2. In this case, the sixth vertical level LV6 may be the same level as a top surface of an upper pad contact 172U. The horizontal cross-section at the sixth vertical level LV6 of the upper contact hole 172H2 may have an elliptical shape having a long axis in the second horizontal direction (Y direction), the horizontal cross-section at the second vertical level LV2 of the upper contact hole 172H2 may have an elliptical shape having a long axis in the first horizontal direction (X direction), and the horizontal cross-section at the first vertical level LV1 of the lower contact hole 172H1 may have an elliptical shape having a long axis in the first horizontal direction (X direction).

In another example embodiment, the horizontal cross-sections of the lower contact hole 172H1 and the upper contact hole 172H2 may be similar to the horizontal cross-sections of the first channel portion C150_1 and the second channel portion C150_2 illustrated in FIG. 8 or 9, respectively.

According to example embodiments, a relatively uniform overlap margin may be secured in all directions at the connection portion of the lower contact hole 172H1 and the upper contact hole 172H2, and accordingly, defects due to misalignment in a process of forming the upper contact hole 172H2 may be prevented or reduced.

Figure 15:
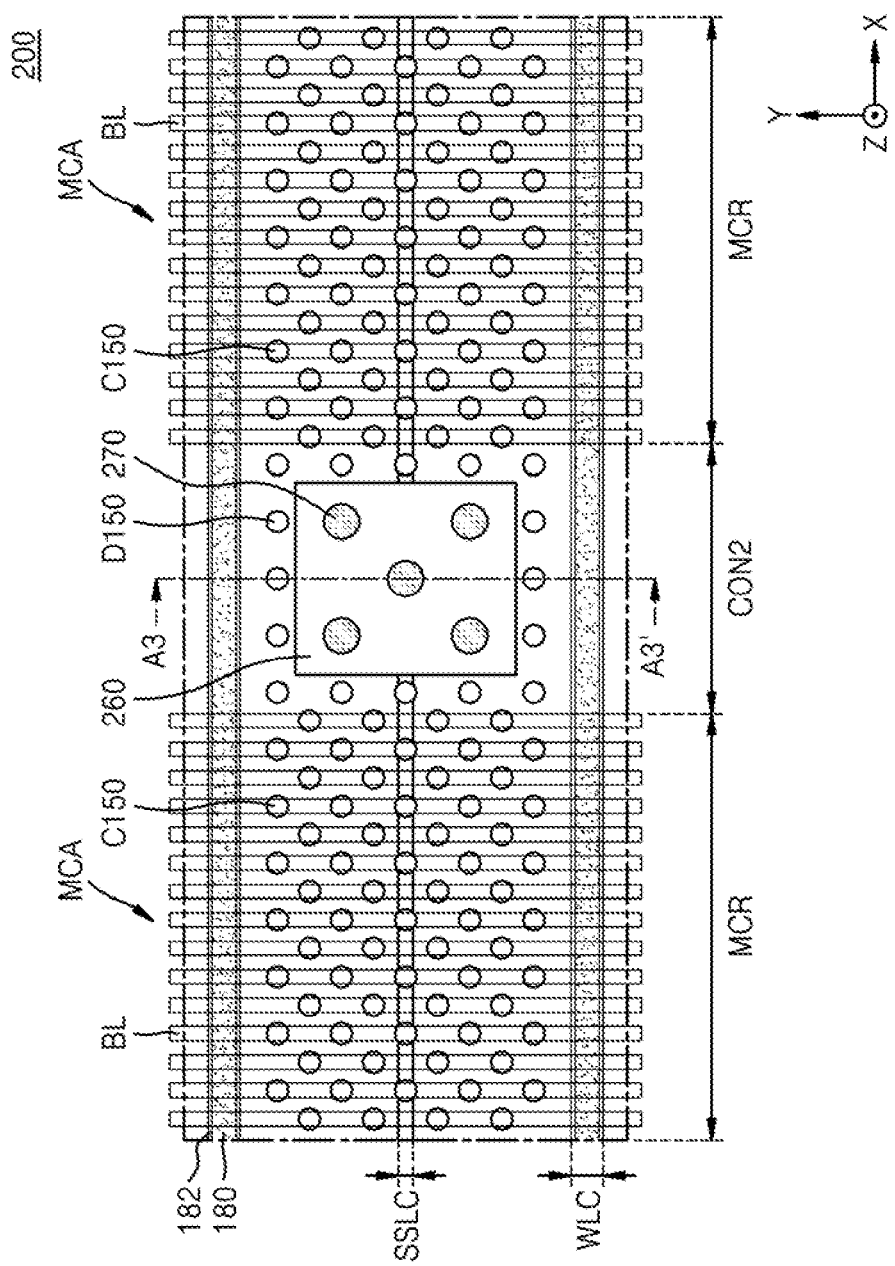
FIG. 15 is a plan view illustrating a representative configuration of a semiconductor device, according to an example embodiment.
Figure 16:
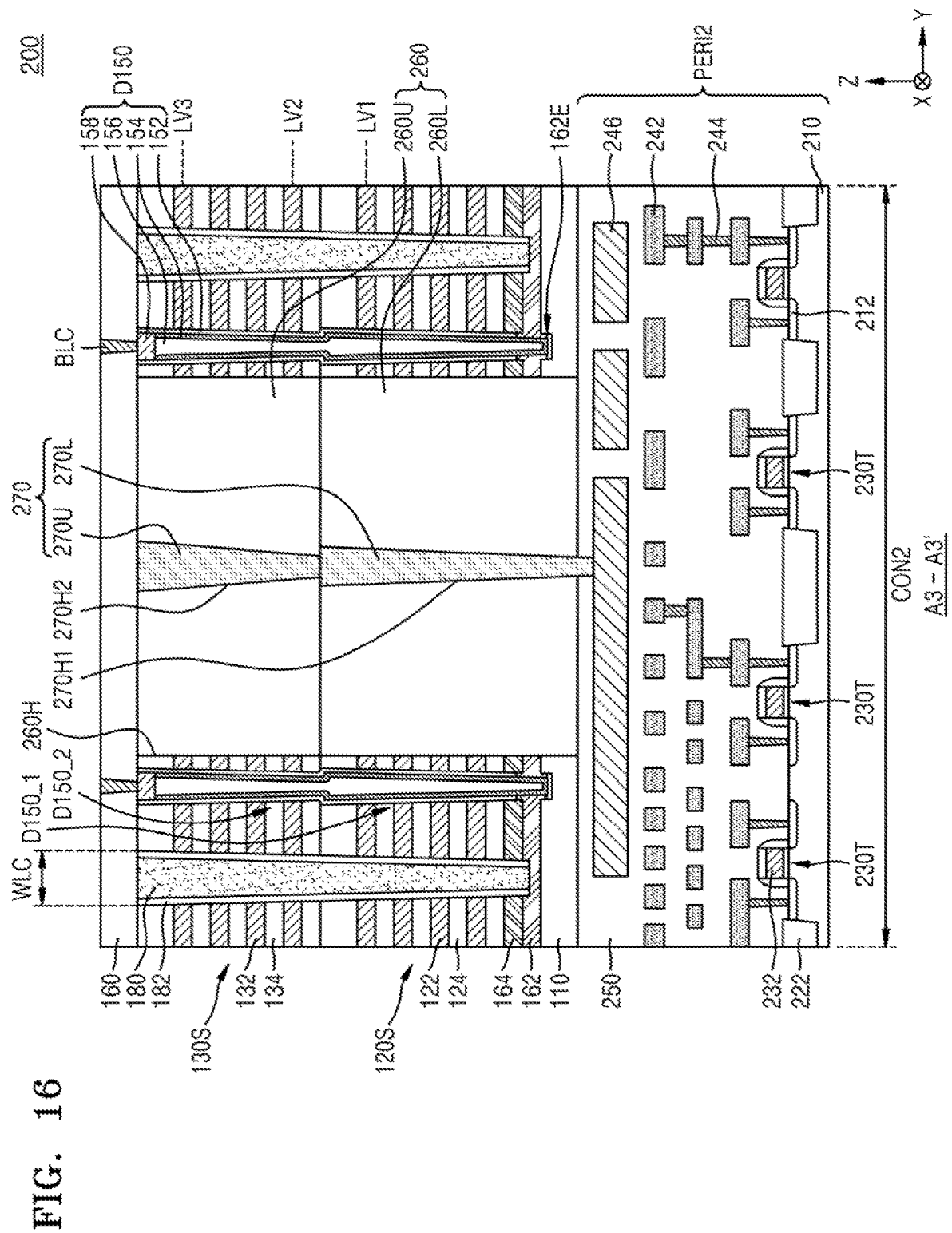
FIG. 16 is a cross-sectional view taken along line A3-A3' in FIG. 15.
Figure 17:
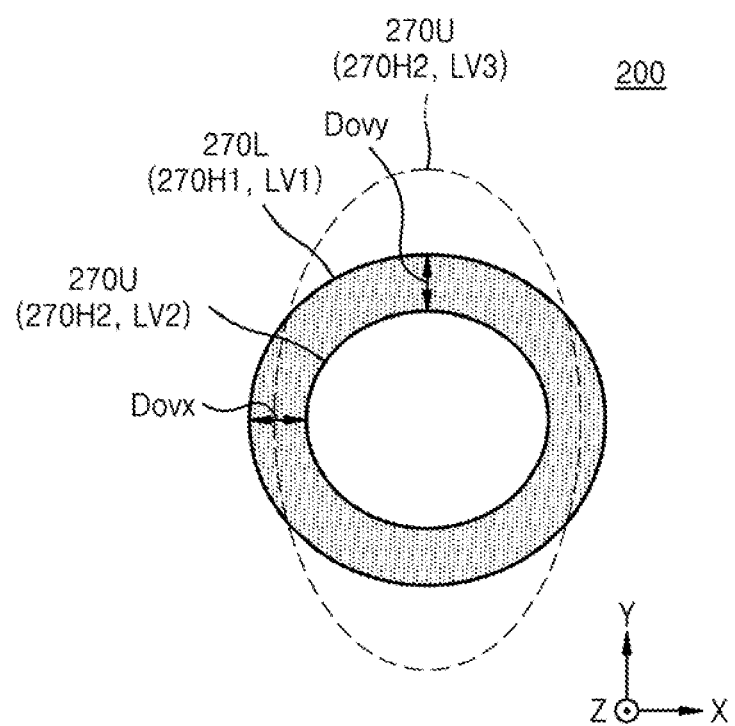
FIG. 17 is a plan view schematically illustrating an arrangement at a connection portion between a lower through electrode and an upper through electrode.

FIG. 15 is a plan view illustrating a representative configuration of a semiconductor device 200, according to an example embodiment. FIG. 16 is a cross-sectional view taken along line A3-A3' in FIG. 15. FIG. 17 is a plan view schematically illustrating an arrangement at a connection portion between a lower through electrode 270L and an upper through electrode 270U. In FIGS. 15 through 17, the same reference numerals as those in FIGS. 1 through 14 may denote the same components.

Referring to FIGS. 15 through 17, a connection region CON2 may be on one side of the memory cell region MCR, and a peripheral circuit region PERI2 may be formed at a lower vertical level than the memory cell region MCR and the connection region CON2. The connection region CON2 may be a region in which a plurality of through electrodes 270 for electrical connection between the memory cell region MCR and the peripheral circuit region PERI2 at a lower vertical level than the memory cell region MCR are arranged. Although one connection region CON2 is illustrated in FIG. 15, unlike this, a plurality of connection regions CON2 may be surrounded by the memory cell region MCR.

A lower substrate 210 may be at a lower vertical level than the substrate 110. An active region (not illustrated) may be defined by an element isolation layer 222 on the lower substrate 210, and a plurality of driving transistors 230T may be formed on the active region. The plurality of driving transistors 230T may include a driving circuit gate structure 232, and an impurity region 212 in a portion of the lower substrate 210 on both sides of the driving circuit gate structure 232.

Over the lower substrate 210, a plurality of wiring layers 242, a plurality of contact plugs 244 connecting each of the plurality of wiring layers 242 or connecting between the plurality of wiring layers 242 and the driving transistor 230T, and a peripheral circuit wiring layer 246 at a higher vertical level than the plurality of wiring layers 242 may be arranged. In addition, on the lower substrate 210, a lower interlayer insulating layer 250 covering the plurality of wiring layers 242, the plurality of contact plugs 244, and the peripheral circuit wiring layer 246 may be arranged, and the substrate 110 may be on the lower interlayer insulating layer 250.

On the substrate 110, a first semiconductor layer 162 and a second semiconductor layer 164 may be sequentially arranged, and on the second semiconductor layer 164, the first gate stack 120S and the second gate stack 130S may be sequentially arranged.

In an example embodiment, the first semiconductor layer 162 may include polysilicon doped with impurities or polysilicon un-doped with impurities, and the second semiconductor layer 164 may also include polysilicon doped with impurities or polysilicon un-doped with impurities. The first semiconductor layer 162 may function as a common source line extension region, and may be a portion corresponding to the common source line CSL in FIG. 1. The second semiconductor layer 164 may function as a support layer to prevent a mold stack from collapsing or falling in the process of removing a sacrificial layer for forming the first semiconductor layer 162. The common source line 180 may be connected to the first semiconductor layer 162.

The plurality of channel structures C150 and the plurality of dummy channel structures D150 may penetrate the first semiconductor layer 162 and the second semiconductor layer 164, and may contact the substrate 110. As illustrated in FIG. 16, a portion of the gate insulating layer 152 may be removed at the same level as the first semiconductor layer 162, and the channel layer 154 may contact an extension portion 162E of the first semiconductor layer 162. Because the gate insulating layer 152 surrounds a bottom surface of the channel layer 154, the channel layer 154 may be electrically connected to the common source line 180 via the first semiconductor layer 162, instead of directly contacting the substrate 110.

In the connection region CON2, an insulating structure 260 may be in an opening 260H penetrating the substrate 110, the first gate stack 120S, and the second gate stack 130S may be arranged. The insulating structure 260 may include a lower insulating layer 260L and an upper insulating layer 260U, the lower insulating layer 260L may have a top surface at the same level as the top surface of the first gate stack 120S, and the upper insulating layer 260U may have a top surface at the same level as the second gate stack 130S.

The plurality of through electrodes 270 may penetrate the insulating structure 260 and be connected to the peripheral circuit wiring layer 246. Each of the plurality of through electrodes 270 may include the lower through electrode 270L and the upper through electrode 270U. The lower through electrode 270L may be in a lower through hole 270H1 penetrating the lower insulating layer 260L, and extend to a level lower than a top surface of the lower interlayer insulating layer 250 to be connected to the peripheral circuit wiring layer 246. The upper through electrode 270U may be in an upper through hole 270H2 penetrating the upper insulating layer 260U, and may be connected to the lower through electrode 270L.

In FIG. 17, a horizontal cross-section at the first vertical level LV1 of the lower through hole 270H1, a horizontal cross-section at the second vertical level LV2 of the upper through hole 270H2, and a horizontal cross-section at the third vertical level LV3 of the upper through hole 270H2 are comparatively illustrated together. The horizontal cross-section at the third vertical level LV3 of the upper through hole 270H2 may have an elliptical shape having a long axis in the second horizontal direction (Y direction), the horizontal cross-section at the second vertical level LV2 of the upper through hole 270H2 may have an elliptical shape having a long axis in the first horizontal direction (X direction), and the horizontal cross-section at the first vertical level LV1 of the lower through hole 270H1 may have an elliptical shape having a long axis in the first horizontal direction (X direction).

In another example embodiment, the horizontal cross-sections of the lower through hole 270H1 and the upper through hole 270H2 may be similar to the horizontal cross-sections of the first channel portion C150_1 and the second channel portion C150_2 illustrated in FIG. 8 or 9, respectively.

According to the above-described example embodiments, a relatively uniform overlap margin may be secured in all directions at a connection portion of the lower through hole 270H1 and the upper through hole 270H2, and accordingly, defects due to misalignment in a process of forming the upper through hole 270H2 may be prevented or reduced.

FIGS. 18A through 22B are schematic diagrams of a method of manufacturing the semiconductor device 100 according to a process sequence, according to an example embodiment. FIGS. 18A, 19A, 20, 21, and 22A are cross-sectional views corresponding to sections taken along the line A1-A1' in FIG. 2, FIGS. 18B, 19B, and 22B are cross-sectional views taken along the line A2-A2' in FIG. 2, FIG. 18C is a horizontal cross-sectional view at the first vertical level, and FIG. 19C illustrates horizontal cross-sectional views at the second vertical level and the third vertical level. In FIGS. 18 through 22B, the same reference numerals as those in FIGS. 1 through 17 may denote the same components.

Figure 18A:
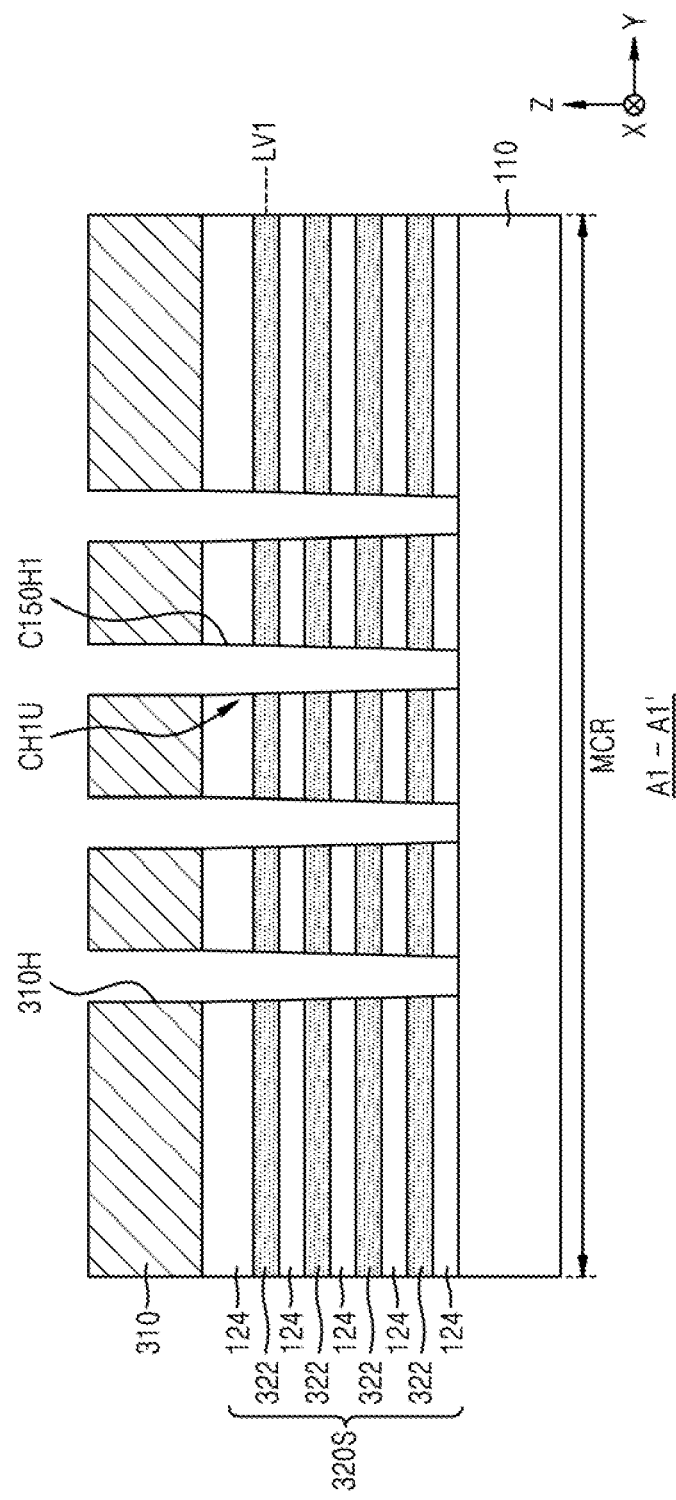
Figure 18B:
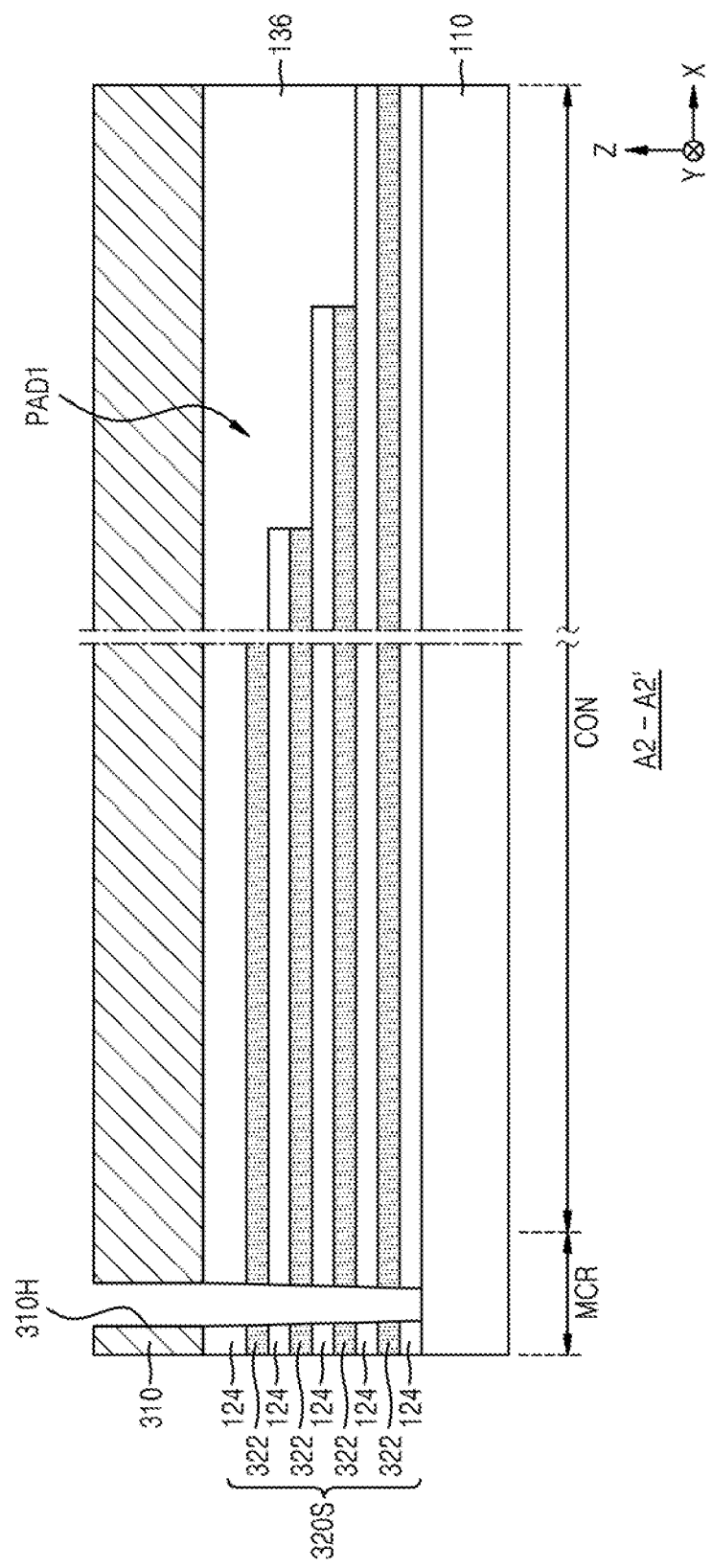
Figure 18C:
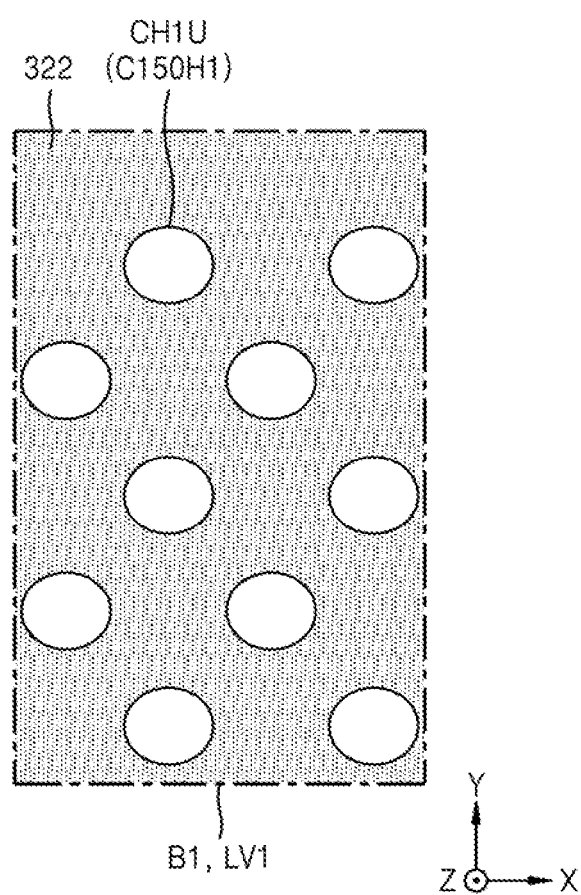
FIG. 18C is a horizontal cross-sectional view at the first vertical level.

Referring to FIGS. 18A through 18C, on the top surface of the substrate 110, a first mold stack 320S may be formed by alternately forming the plurality of first insulating layers 124 and a plurality of first sacrificial layers 322. In an example embodiment, the plurality of first insulating layers 124 may include an insulating material such as silicon oxide and silicon oxynitride, and the plurality of first sacrificial layers 322 may include silicon nitride, silicon oxynitride, or polysilicon doped with impurities, etc.

Next, a first pad part PAD1 may be formed by sequentially patterning the first mold stack 320S in the connection region CON. In an example embodiment, the first pad portion PAD1 may be formed in a step shape having a difference in top surface levels in the first horizontal direction (X direction).

Next, the lower cover insulating layer 136 covering the first pad portion PAD1 may be formed. The lower cover insulating layer 136 may include an insulating material such as silicon oxide and silicon oxynitride.

Thereafter, the mask pattern 310 having the opening 310H may be formed on the first mold stack 320S. The first channel hole portion C150H1 may be formed by patterning the first mold stack 320S by using the mask pattern 310 as an etch mask.

As illustrated in FIG. 18C, the first channel hole upper end CH1U of the first channel hole portion C150H1 may have a horizontal cross-section of an elliptical shape having a long axis in the first horizontal direction (X direction).

Figure 19A:
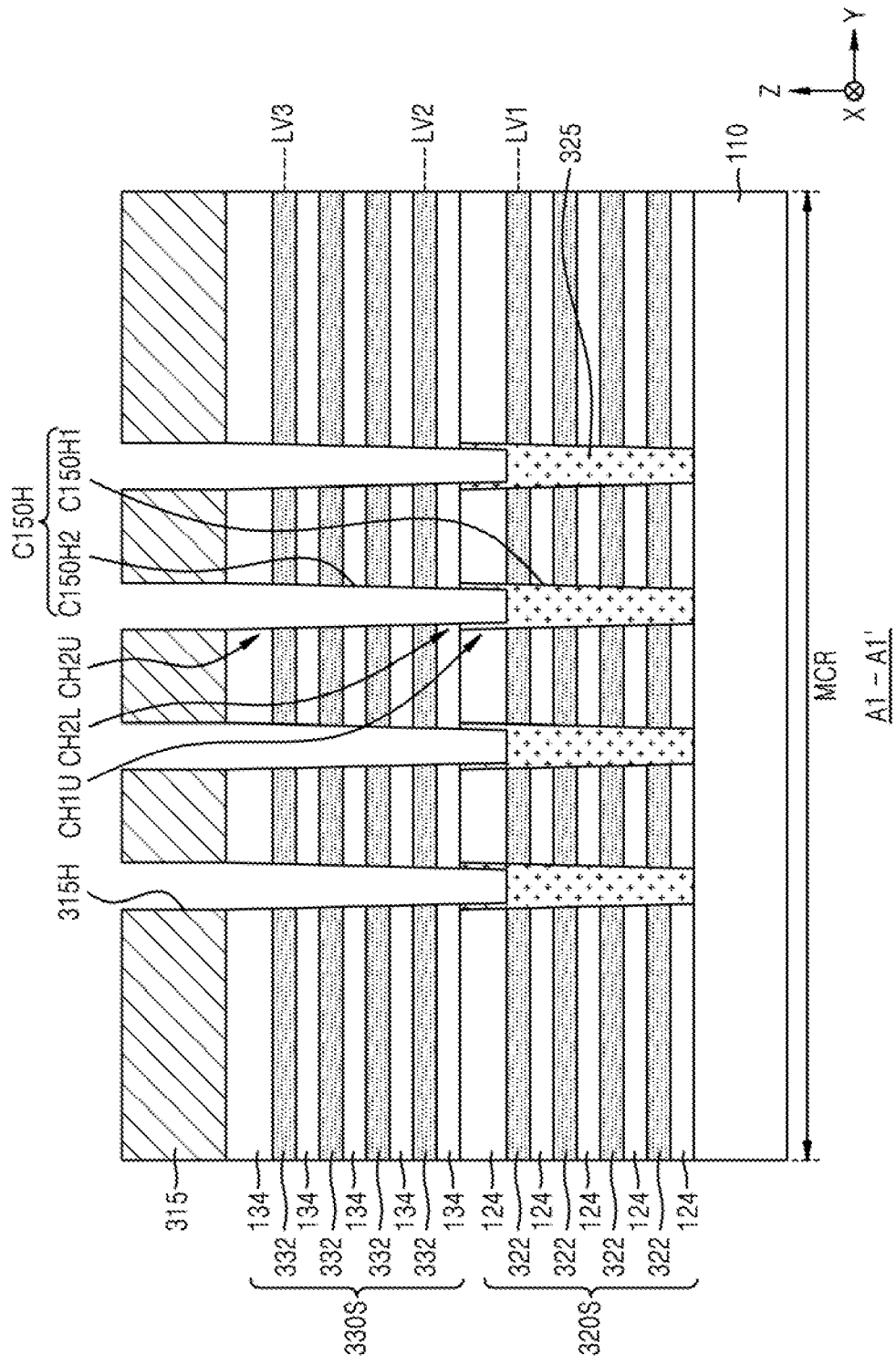
Figure 19C:
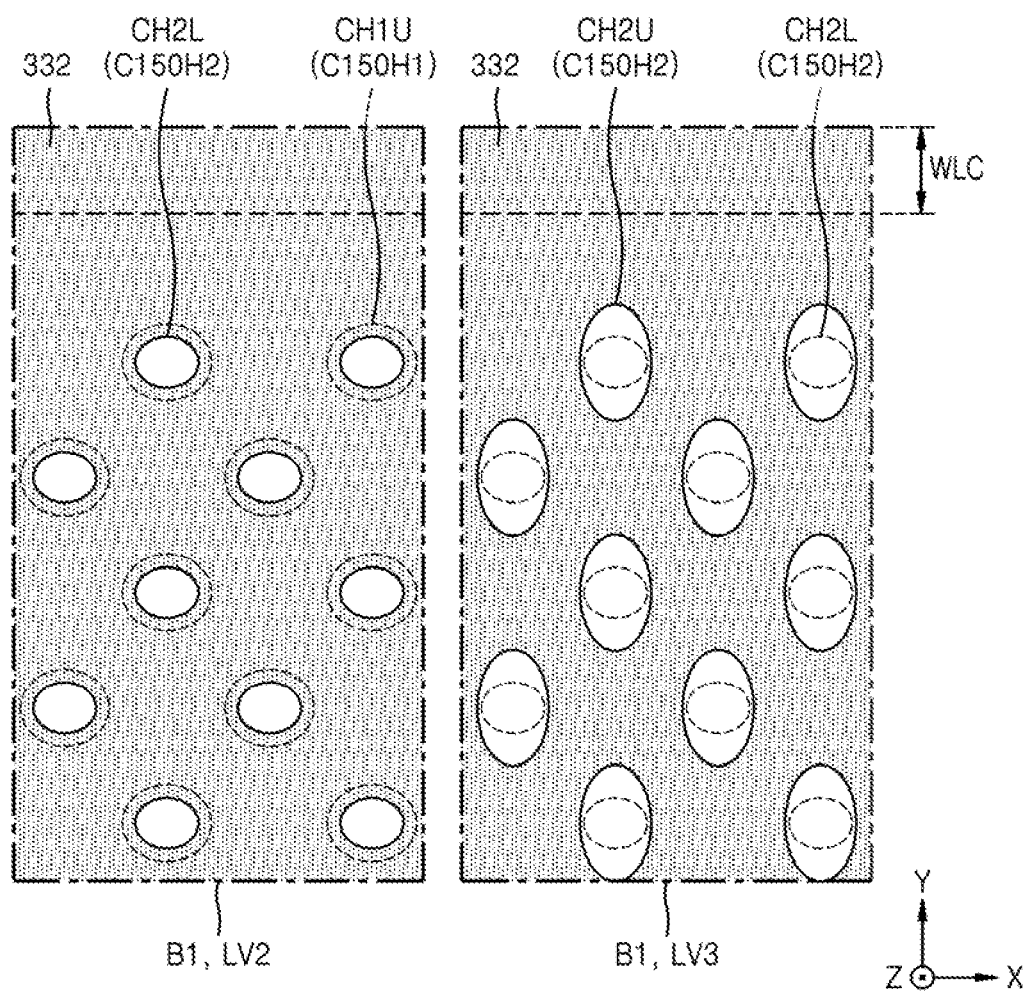
FIG. 19C is a horizontal cross-sectional views at the second vertical level and the third vertical level.

Referring to FIGS. 19A through 19C, a protective layer 325 filling the inside of the first channel hole portion C150H1 may be formed. In an example embodiment, after the first channel hole portion C150H1 is filled with a conductive material, the protective layer 325 may be formed by planarizing an upper portion of the conductive material until the top surface of the first mold stack 320S is exposed. The protective layer 325 may be formed by using, e.g., at least one material of metal, polysilicon, amorphous carbon, and spin on hardmask (SOH).

Next, a second mold stack 330S may be formed by alternately forming the plurality of second insulating layers 134 and the plurality of second sacrificial layers 332 on the first mold stack 320S. In an example embodiment, the plurality of second insulating layers 134 may include an insulating material such as silicon oxide and silicon oxynitride, and the plurality of second sacrificial layers 332 may include silicon nitride, silicon oxynitride, or polysilicon doped with impurities, etc.

Next, a second pad part PAD2 may be formed by sequentially patterning the second mold stack 330S in the connection region CON. In an example embodiment, the second pad portion PAD2 may be formed in a step shape having a difference in top surface levels in the first horizontal direction (X direction).

Next, the upper cover insulating layer 138 covering the second pad portion PAD2 may be formed. The upper cover insulating layer 138 may include an insulating material such as silicon oxide and silicon oxynitride.

Thereafter, a mask pattern 315 having an opening 310H may be formed on the second mold stack 330S. The second channel hole portion C150H2 may be formed by patterning the second mold stack 330S by using the mask pattern 315 as an etch mask.

As illustrated in FIG. 19C, the second channel hole upper end CH2U of the second channel hole portion C150H2 may have a horizontal cross-section of an elliptical shape having a long axis in the second horizontal direction (Y direction), whereas the second channel hole lower end CH2L of the second channel hole portion C150H2 may have a cross-section of an elliptical shape having a long axis extending in the first horizontal direction (X direction).

In an example embodiment, in the process of forming the second channel hole portion C150H2 adjacent to the word line cut region WLC, etching may be reduced in a particular direction (that is, asymmetric etching may occur). In this case, the second channel hole portion C150H2 may have an asymmetric shape in which the horizontal cross-sectional shape of the second channel hole upper end CH2U is different from the horizontal cross-sectional shape of the second channel hole lower end CH2L.

Additionally, the second channel hole lower end CH2L may have an elliptical horizontal cross-section similar to the first channel hole upper end CH1U, and an overlap margin in all directions between the second channel hole lower end CH2L and the first channel hole upper end CH1U may be relatively uniform. Accordingly, the second channel hole lower end CH2L may be correctly landed in a region of the first channel hole upper end CH1U, and misalignment or bad connection of the second channel hole lower end CH2L and the first channel hole upper end CH1U may be reduced or prevented.

Figure 20:
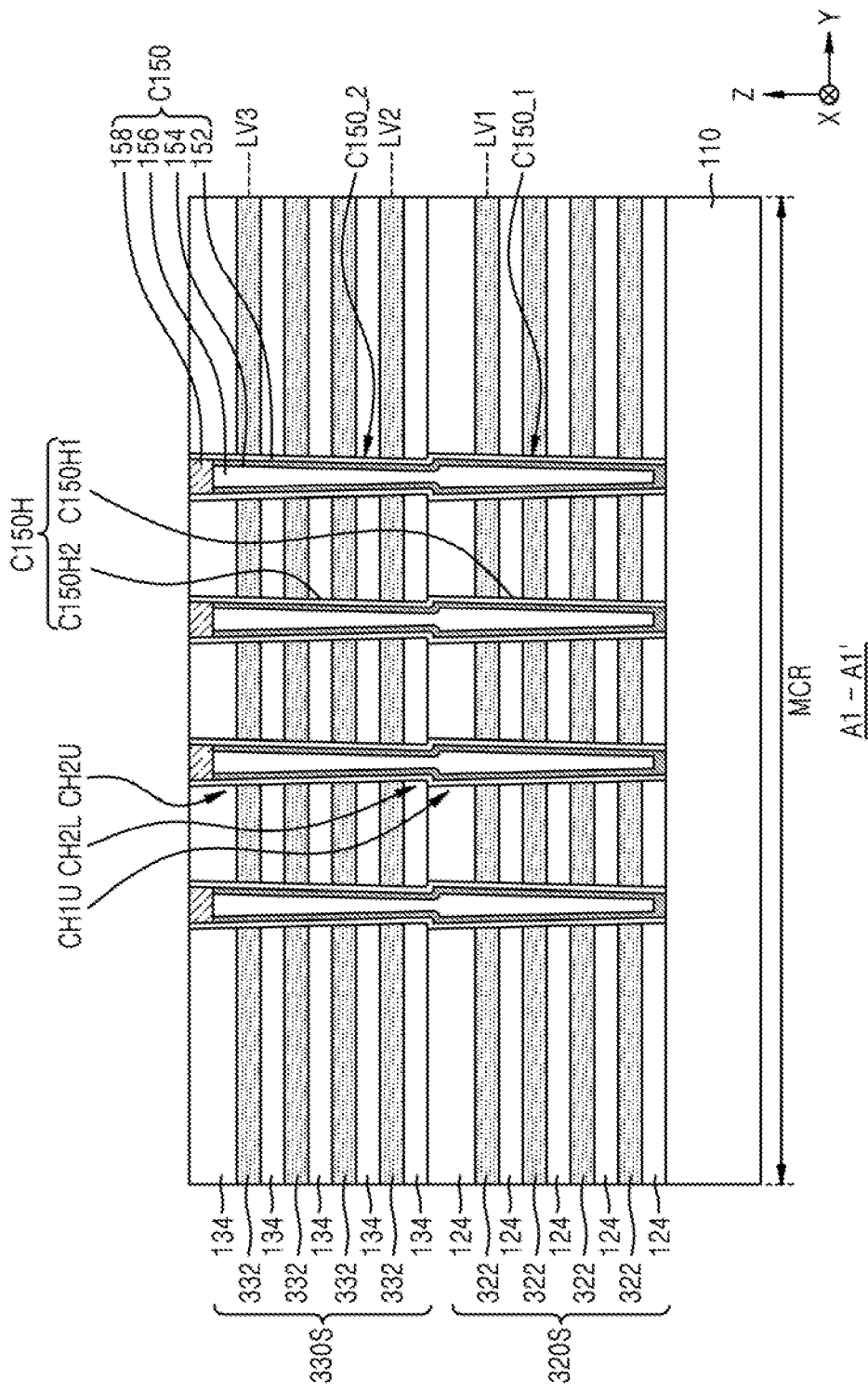

Referring to FIG. 20, the protective layer 325 (refer to FIG. 19A) formed in the first channel hole portion C150H1 may be removed.

Next, the channel structure C150 including the gate insulating layer 152, the channel layer 154, the buried insulating layer 156, and the conductive plug 158 may be formed on the inner walls of the first channel hole portion C150H1 and the second channel hole portion C150H2.

Figure 21:
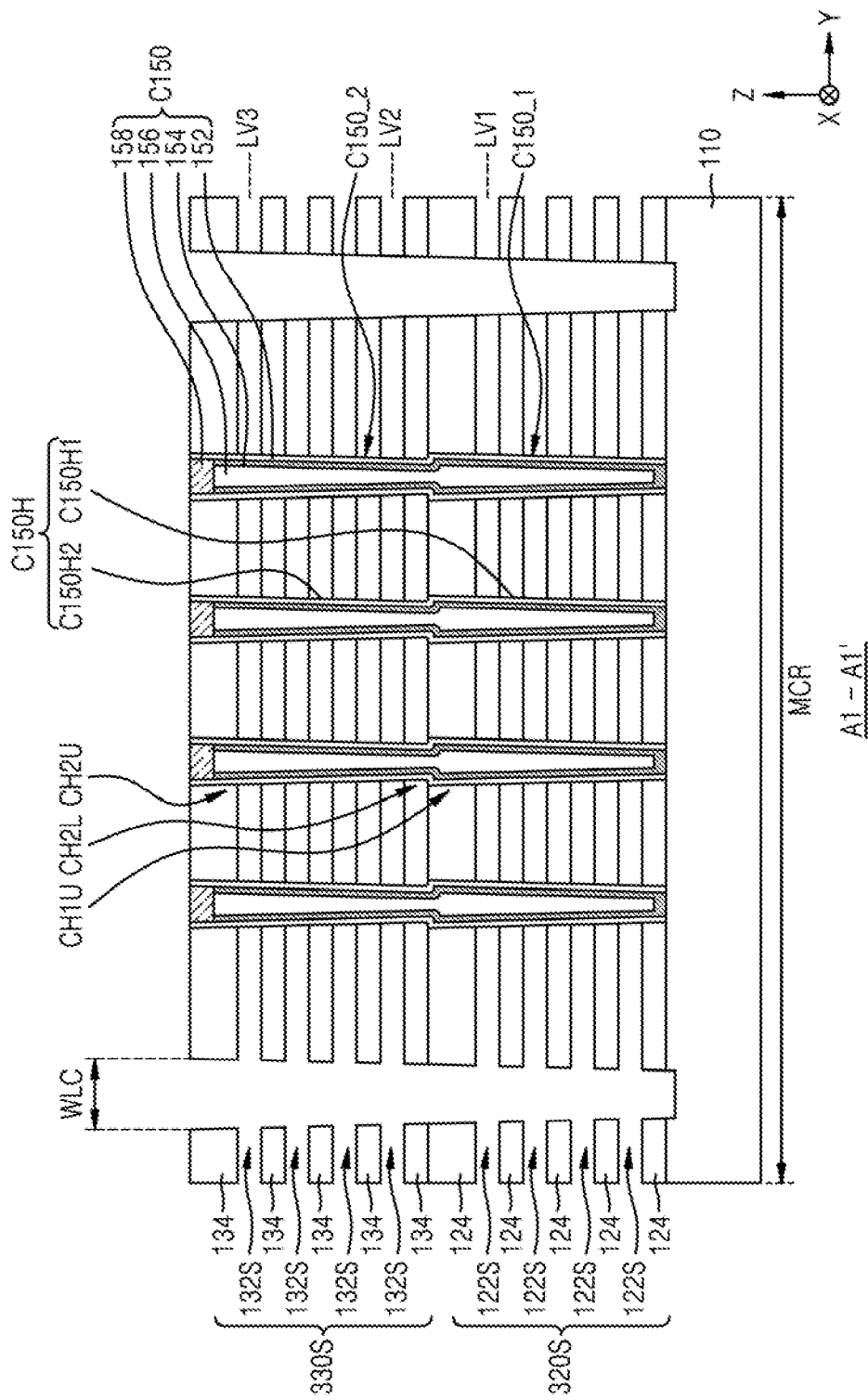

Referring to FIG. 21, a mask pattern (not illustrated) may be formed on the second mold stack 330S, and the word line cut region WLC may be formed by removing portions of the second mold stack 330S and the first mold stack 320S by using the mask pattern as an etching mask. The top surface of the substrate 110 may be exposed to a bottom portion of the word line cut region WLC.

Thereafter, the plurality of first sacrificial layers 322 and the plurality of second sacrificial layers 332 that are exposed to the sidewalls of the word line cut region WLC may be removed, a first gate space 122S may be formed at a location where the first sacrificial layer 322 has been removed, and a second gate space 132S may be formed at a location where the second sacrificial layer 332 has been removed. In an example embodiment, a removing process of the plurality of first sacrificial layers 322 and the plurality of second sacrificial layers 332 may be a wet etching process using, e.g., a phosphoric acid solution as an etchant.

Figure 22A:
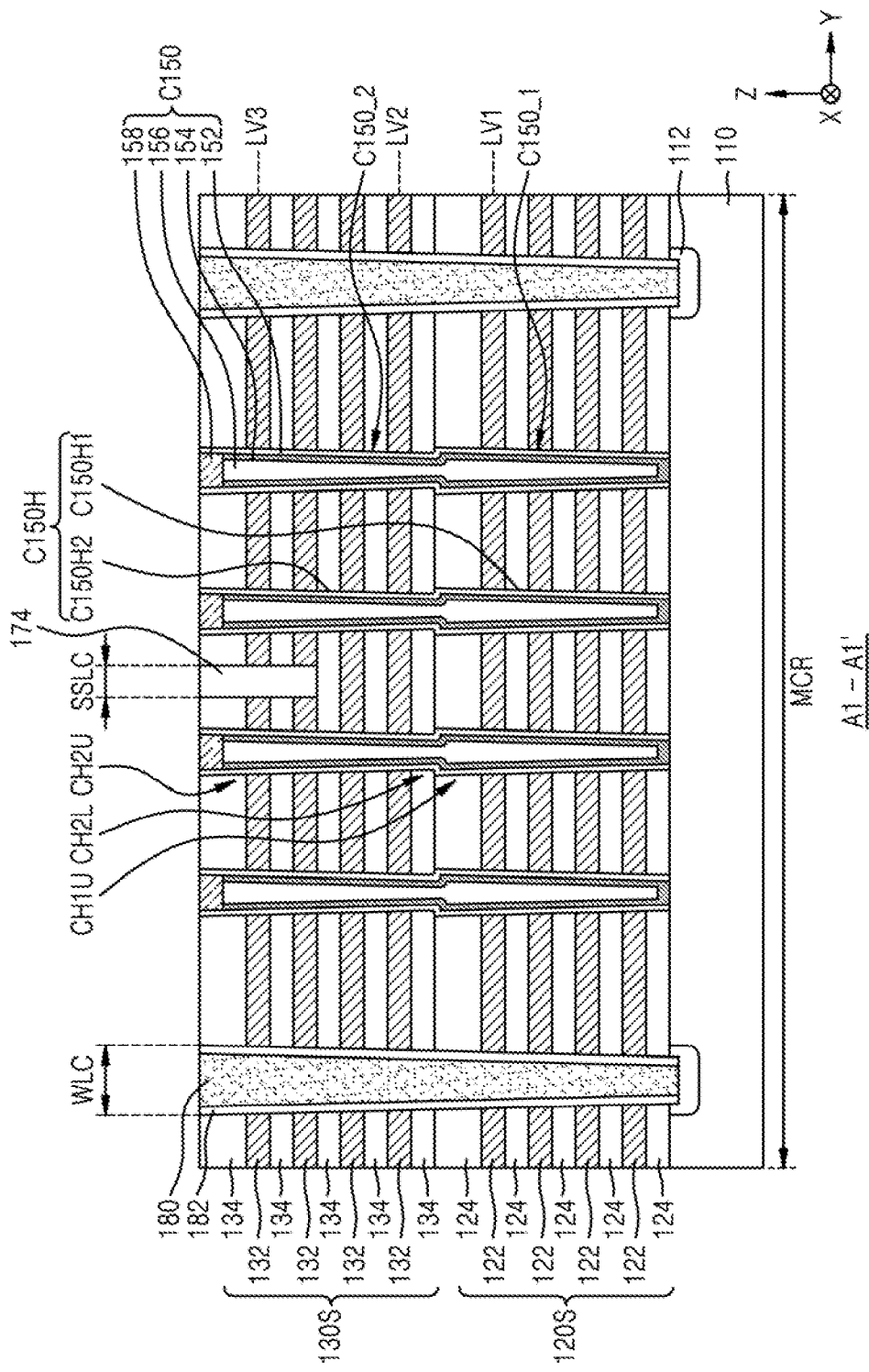
Figure 22B:
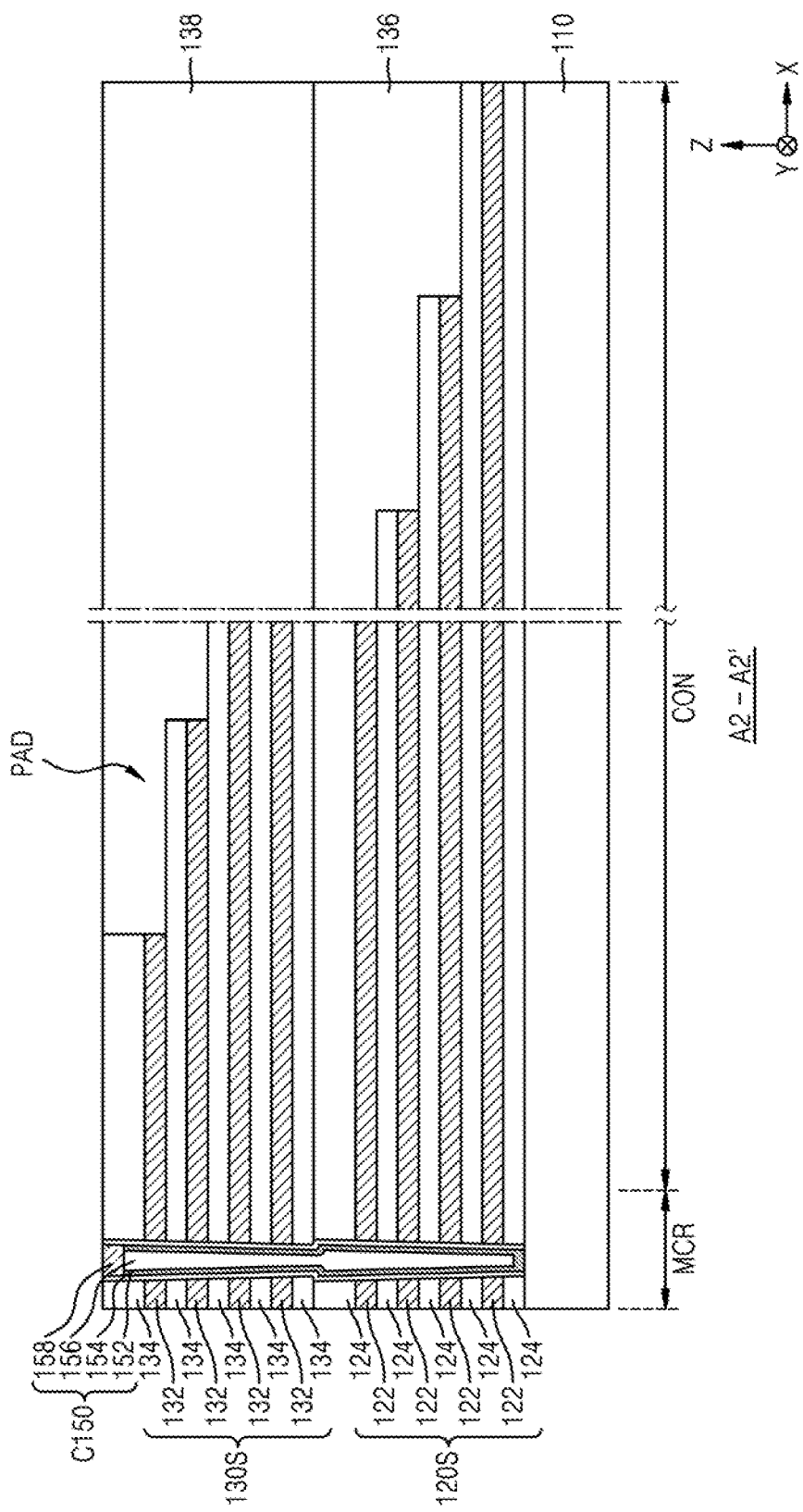

Referring to FIGS. 22A and 22B, by filling the word line cut region WLC, the first gate space 122S, and the second gate space 132S with a metal material, and removing the metal material in the word line cut region WLC, the first gate electrode 122 may be formed between the insulating layers 124 of the first mold stack 320S (refer to FIG. 21), and the second gate electrode 132 may be formed between the insulating layers 134 of the second mold stack 330S (refer to FIG. 21).

By implanting impurities into the substrate 110 via the word line cut region WLC, the common source region 112 may be formed in the portion of the substrate 110 at the bottom portion of the word line cut region WLC.

Next, the insulating spacer 182 and the common source line 180 may be formed on the sidewalls of the word line cut region WLC.

Thereafter, by removing a portion of two uppermost second gate electrodes 132 in the memory cell region MCR, and filling the removed portion with an insulating material, the string separation insulating layer 174 may be formed. In another example embodiment, the string separation insulating layer 174 may be formed after removing a portion of two of the uppermost second sacrificial layers 332 and before forming the word line cut region WLC.

Referring to FIG. 3 again, the upper insulating layer 124 may be formed on the first gate electrode 122, and the bit line contact BLC that penetrates the upper insulating layer 124 and electrically contacts the channel structure C150 may be further formed. Next, the bit line BL that is connected to the bit line contact BLC and extends in the second horizontal direction (Y direction) may be further formed on the upper insulating layer 160.

The semiconductor device 100 may be completed by performing the above-described processes.

According to example embodiments, even when the second channel hole portion C150H2 is formed in an asymmetrical shape, a relatively uniform overlap margin at the connection portion between the first channel hole portion C150H1 and the second channel hole portion C150H2 may be secured. Therefore, process defects due to misalignment of the second channel hole portion C150H2 in the process of forming the second channel hole portion C150H2 may be prevented or reduced.

By way of summation and review, manufacturing difficulties may be presented as the degree of integration of a memory device increases and a number of gate electrode layers stacked in a vertical direction increases.

As described above, embodiments relate to a semiconductor device including a channel structure extending in a vertical direction and a method of manufacturing the same. Embodiments may provide a semiconductor device having a large vertical height and preventing defects in a channel hole forming process. Embodiments may provide a manufacturing method of a semiconductor device having a large vertical height and preventing defects in a channel hole forming process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first gate stack arranged on a substrate and including a plurality of first gate electrodes and a plurality of first insulating layers that are alternately arranged;
   a second gate stack arranged on the first gate stack and including a plurality of second gate electrodes and a plurality of second insulating layers that are alternately arranged; and
   a plurality of channel structures arranged in a plurality of channel holes, the plurality of channel holes penetrating the first gate stack and the second gate stack and being spaced apart from each other in a first direction and a second direction that are parallel with a top surface of the substrate, wherein:
   each of the plurality of channel holes includes a first channel hole portion penetrating the first gate stack and a second channel hole portion penetrating the second gate stack, and
   a ratio of a second width in the second direction to a first width in the first direction of a first channel hole upper end of the first channel hole portion is less than a ratio of a fourth width in the second direction to a third width in the first direction of a second channel hole upper end of the second channel hole portion.

2. The semiconductor device as claimed in claim 1, wherein a ratio of a sixth width in the second direction to a fifth width in the first direction of a second channel hole lower end of the second channel hole portion is less than the ratio of the fourth width in the second direction to the third width in the first direction of a second channel hole upper end of the second channel hole portion.

3. The semiconductor device as claimed in claim 2, wherein:
   the fifth width in the first direction of the second channel hole lower end is less than the first width in the first direction of the first channel hole upper end, and
   the sixth width in the second direction of the second channel hole lower end is less than the second width in the second direction of the first channel hole upper end.

4. The semiconductor device as claimed in claim 2, wherein:
   the first channel hole upper end has a horizontal cross-section having a circular shape at an identical vertical level to that of an uppermost first gate electrode among the plurality of first gate electrodes, and
   the second channel hole lower end has a horizontal cross-section of a circular shape at an identical vertical level to that of a lowermost second gate electrode among the plurality of second gate electrodes.

5. The semiconductor device as claimed in claim 1, further comprising a common source line penetrating the first gate stack and the second gate stack, the common source line being in a word line cut region and extending in the first direction.

6. The semiconductor device as claimed in claim 1, wherein:
   the second channel hole upper end has a horizontal cross-section having an elliptical shape at an identical vertical level to that of an uppermost second gate electrode among the plurality of second gate electrodes, and
   a length of a long axis of the elliptical shape corresponds to the fourth width, and a length of a short axis of the elliptical shape corresponds to the third width.

7. The semiconductor device as claimed in claim 1, wherein:
   the first channel hole upper end has a horizontal cross-section having an elliptical shape at an identical vertical level to that of an uppermost first gate electrode among the plurality of first gate electrodes, and
   a length of a long axis of the elliptical shape corresponds to the first width, and a length of a short axis of the elliptical shape corresponds to the second width.

8. The semiconductor device as claimed in claim 1, wherein:
   the first channel hole upper end has a horizontal cross-section having an elliptical shape at an identical vertical level to that of an uppermost first gate electrode among the plurality of first gate electrodes, and
   a length of a long axis of the elliptical shape corresponds to the second width, and a length of a short axis of the elliptical shape corresponds to the first width.

9. The semiconductor device as claimed in claim 1, further comprising a third gate stack arranged on the first gate stack and including a plurality of third gate electrodes and a plurality of third insulating layers that are alternately arranged,
   wherein each of the plurality of channel holes includes the first channel hole portion penetrating the first gate stack, the second channel hole portion penetrating the second gate stack, and a third channel hole portion penetrating the third gate stack.

10. A semiconductor device, comprising:
    a plurality of first gate electrodes arranged on a substrate and spaced apart from each other in a direction perpendicular to a top surface of the substrate;
    a plurality of second gate electrodes arranged on the plurality of first gate electrodes and spaced apart from each other in a direction perpendicular to the top surface of the substrate;
    a plurality of channel structures in a plurality of channel holes penetrating the plurality of first gate electrodes and the plurality of second gate electrodes; and
    a common source line region extending in a first direction parallel with the top surface of the substrate on one side of the plurality of first gate electrodes and the plurality of second gate electrodes, wherein:
    each of the plurality of channel holes includes a first channel hole portion penetrating the plurality of first gate electrodes, and a second channel hole portion penetrating the plurality of second gate electrodes, and
    a ratio of a second width in a second direction to a first width in the first direction of a first channel hole upper end of the first channel hole portion is less than a ratio of a fourth width in the second direction to a third width in the first direction of a second channel hole upper end of the second channel hole portion.

11. The semiconductor device as claimed in claim 10, wherein:
    the ratio of the second width to the first width of the first channel hole upper end is in a range of about 0.5 to about 1, and
    the ratio of the fourth width to the third width of the second channel hole upper end is in a range of about 1 to about 2.

12. The semiconductor device as claimed in claim 10, wherein:
the plurality of channel structures include a first horizontal cross-section at an identical level to that of an uppermost first gate electrode, and a second horizontal cross-section at an identical level to that of an uppermost second gate electrode, and
the first horizontal cross-section has an elliptical shape having a long axis in the first direction and the second horizontal cross-section has an elliptical shape having a long axis in the second direction.

13. The semiconductor device as claimed in claim 10, wherein:
the plurality of channel structures includes a third horizontal cross-section at an identical level to that of a lowermost second gate electrode, and
the third horizontal cross-section has an elliptical shape having a long axis in the first direction.

14. The semiconductor device as claimed in claim 10, wherein:
the plurality of channel structures include a first horizontal cross-section at an identical level to that of an uppermost first gate electrode, and a second horizontal cross-section at an identical level to that of an uppermost second gate electrode, and
the first horizontal cross-section has an elliptical shape having a long axis in the first direction, and the second horizontal cross-section has an elliptical shape having a long axis in the first direction.

15. A semiconductor device, comprising:
a plurality of first gate electrodes arranged on a substrate and spaced apart from each other in a direction perpendicular to a top surface of the substrate;
a plurality of second gate electrodes arranged on the plurality of first gate electrodes and spaced apart from each other in a direction perpendicular to the top surface of the substrate;
a plurality of channel structures in a plurality of channel holes penetrating the plurality of first gate electrodes and the plurality of second gate electrodes; and
a common source line extending in a first direction parallel with the top surface of the substrate on one side of the plurality of first gate electrodes and the plurality of second gate electrodes, wherein:
the plurality of channel structures include a first horizontal cross-section at an identical level to that of an uppermost first gate electrode, and a second horizontal cross-section at an identical level to that of an uppermost second gate electrode, and
the first horizontal cross-section has an elliptical shape having a long axis in the first direction, and the second horizontal cross-section has an elliptical shape having a long axis in a second direction that is parallel with the top surface of the substrate and perpendicular to the first direction.

16. The semiconductor device as claimed in claim 15, wherein:
the plurality of channel structures includes a third horizontal cross-section at an identical level to that of a lowermost second gate electrode, and
the third horizontal cross-section has an elliptical shape having a long axis in the second direction.

17. The semiconductor device as claimed in claim 15, wherein:
each of the plurality of channel holes includes a first channel hole portion penetrating the plurality of first gate electrodes, and a second channel hole portion penetrating the plurality of second gate electrodes, and
a ratio of a second width in the second direction to a first width in the first direction of a first channel hole upper end is less than a ratio of a fourth width in the second direction to a third width in the first direction of a second channel hole upper end.

18. The semiconductor device as claimed in claim 17, wherein a ratio of a sixth width in the second direction to a fifth width in the first direction of a second channel hole lower end is less than the ratio of the fourth width in the second direction to the third width in the first direction of the second channel hole upper end.

19. The semiconductor device as claimed in claim 18, wherein:
the fifth width of the second channel hole lower end is less than the first width of the first channel hole upper end, and
the sixth width of the second channel hole lower end is less than the second width of the first channel hole upper end.

20. The semiconductor device as claimed in claim 17, further comprising a plurality of third gate electrodes arranged on the plurality of second gate electrodes and spaced apart from each other in a direction perpendicular to the top surface of the substrate,
wherein each of the plurality of channel holes further includes a third channel hole portion penetrating the plurality of third gate electrodes and located at a higher level than the second channel hole portion.

* * * * *